US009697874B1

(12) United States Patent
Asnaashari et al.

(10) Patent No.: US 9,697,874 B1
(45) Date of Patent: Jul. 4, 2017

(54) MONOLITHIC MEMORY COMPRISING 1T1R CODE MEMORY AND 1TNR STORAGE CLASS MEMORY

(71) Applicant: Crossbar, Inc., Santa Clara, CA (US)

(72) Inventors: Mehdi Asnaashari, Danville, CA (US); Sundar Narayanan, Cupertino, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 15/178,144

(22) Filed: Jun. 9, 2016

Related U.S. Application Data

(60) Provisional application No. 62/173,151, filed on Jun. 9, 2015.

(51) Int. Cl.
| | |
|---|---|
| *G11C 5/12* | (2006.01) |
| *G11C 13/00* | (2006.01) |
| *H01L 45/00* | (2006.01) |
| *H01L 27/24* | (2006.01) |

(52) U.S. Cl.
CPC .............. *G11C 5/12* (2013.01); *G11C 13/003* (2013.01); *G11C 13/0007* (2013.01); *H01L 27/2436* (2013.01); *H01L 27/2481* (2013.01); *H01L 45/06* (2013.01); *H01L 45/16* (2013.01); *G11C 2213/79* (2013.01)

(58) Field of Classification Search
CPC ... G11C 5/12; G11C 13/0002; G11C 13/0004; G11C 13/003; G11C 2213/79; H01L 27/2436; H01L 27/2481; H01L 45/06; H01L 45/16

USPC .... 365/63, 72, 148, 158, 163, 185.08, 189.2
See application file for complete search history.

(56) References Cited

U.S. PATENT DOCUMENTS

| | | | |
|---|---|---|---|
| 6,839,260 B2 * | 1/2005 | Ishii ..................... | B82Y 10/00 257/E21.661 |
| 7,215,568 B2 | 5/2007 | Liaw et al. | |
| 7,719,882 B2 | 5/2010 | Lin et al. | |
| 7,952,956 B2 | 5/2011 | Wang et al. | |
| (Continued) | | | |

FOREIGN PATENT DOCUMENTS

| | | |
|---|---|---|
| WO | 2015051694 A1 | 4/2015 |

*Primary Examiner* — Tan T. Nguyen
(74) *Attorney, Agent, or Firm* — Amin, Turocy & Watson, LLP

(57) ABSTRACT

Providing for a monolithic memory device comprising a combination of a one-transistor, one-resistor (1T1R) memory array, and a one-transistor, multiple-resistor (1TnR, where n is a suitable integer greater than 1) memory array is described herein. By way of example, the monolithic memory device can be a stand-alone device, configured to perform functions in response to predetermined conditions and generate an output(s), or can be a removable device that can be connected to and operable with another device. In various embodiments, the 1TnR array having high memory density can serve as storage class memory (SCM) for the monolithic memory device, and the 1T1R array having high performance and efficacy can serve as code memory. In addition to the foregoing, the 1T1R array and the 1TnR array can be fabricated from at least one common layer or a common processing step, to simplify and lower cost of fabricating disclosed memory devices.

40 Claims, 20 Drawing Sheets

(56) References Cited

U.S. PATENT DOCUMENTS

2010/0211725 A1* 8/2010 Nagashima ........ G11C 13/0004
   711/103
2015/0340316 A1* 11/2015 Or-Bach ................ G11C 5/025
   257/2
2016/0043137 A1* 2/2016 Lu ....................... H01L 27/2436
   365/148

* cited by examiner

MONOLITHIC MEMORY COMPRISING 1T1R CODE MEMORY AND 1TNR STORAGE CLASS MEMORY

CROSS REFERENCE TO RELATED APPLICATIONS

The present application for patent claims the benefit of priority of U.S. Provisional Patent Application Ser. No. 62/173,151 entitled: MONOLITHIC MEMORY COMPRISING 1T1R CODE MEMORY AND 1TnR STORAGE CLASS MEMORY, and filed Jun. 9, 2015, which is hereby incorporated by reference herein in its entirety and for all purposes.

TECHNICAL FIELD

This disclosure relates generally to electronic memory; as one example, the disclosure describes an electronic memory comprising multiple banks of non-volatile memory with a high-speed interface and expanded command and address bus.

BACKGROUND

A recent innovation within the field of integrated circuit technology is two-terminal memory technology. Two-terminal memory technology is contrasted, for instance, with gate-controlled transistors in which conductivity between two terminals is mediated by a third terminal, called a gate terminal. Two-terminal memory devices can differ from three terminal devices in function as well as structure. For instance, some two-terminal devices can be constructed between a pair of conductive contacts, as opposed to having a third terminal that is adjacent to a set of conductive terminals. Rather than being operable through a stimulus applied to the third terminal, two-terminal memory devices can be controlled by applying a stimulus at one or both of the pair of conductive contacts. The inventor(s) of the present disclosure is further aware of a variety of two-terminal memory technologies, such as phase-change memory, magneto-resistive memory, conductive-bridging memory, as well as others.

One two-terminal memory worth noting is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

As models of resistive memory technology are tested and results obtained, the results are speculatively extrapolated to memory devices in which resistive memory replaces a conventional memory. For instance, the assignee of the present invention has conducted research related to software models of memory arrays comprising resistive memory instead of complementary metal-oxide semiconductor (CMOS) NAND or NOR memory. Software projections suggest that two-terminal memory arrays can provide significant benefits for electronic devices, including reduced power consumption, higher memory density, advanced technology nodes, or improved performance, among others.

In light of the above, the inventor(s) endeavors to discover applications where two-terminal memory can provide real-world benefits for electronic devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The disclosed subject matter provides for a monolithic memory device comprising a combination of one or more one-transistor, one-resistor (1T1R) memory arrays, and one or more one-transistor, multiple-resistor (1TnR, where n is a suitable integer greater than 1) memory arrays. The monolithic memory device can be a stand-alone device, configured to perform functions in response to predetermined conditions and generate an output(s), or can be a removable device that can be connected to and operate in conjunction with another device. In some embodiments, the 1TnR array having high memory density can serve as storage class memory (SCM) for the monolithic memory device, and in further embodiments, the 1T1R array having high performance and efficacy can serve as code memory. Application code, instructions, logic, and other frequently accessed data or high performance data, can be stored at the 1T1R array, whereas infrequently accessed data or large data quantities can be stored at the 1TnR array.

In further embodiments, disclosed monolithic memory devices can comprise metal oxide semiconductor (MOS) components formed in a substrate thereof. The MOS components can include CMOS, nMOS or pMOS devices, in one or more embodiments, where suitable. Further, one or more MOS components can be operably connected to the 1T1R array(s) or the 1TnR array(s), including processor(s), memory controller(s), error correction logic, and so on.

According to at least some disclosed embodiments, a disclosed monolithic semiconductor device comprises 1T1R memory and 1TnR memory formed in at least one common layer. For instance, a process layer employed to provide a subset of the 1T1R memory can also provide a subset of the 1TnR memory. In this manner, complexity and cost of manufacturing the monolithic semiconductor device can be reduced. In some embodiments, a resistive switching layer of a 1T1R array and of a 1TnR array can be provided with a single layer. In further embodiments, a top electrode of the 1T1R array and the 1TnR array can be provided with a single layer. In still other embodiments, a bottom electrode of the 1T1R array and the 1TnR array can be provided with a single layer. Other layers, such as a contact layer, adhesion layer, barrier layer, or the like, can also be shared between the 1T1R array and the 1TnR array. In some embodiments, a common layer can have a different function in the 1T1R array compared with the 1TnR array, and in some cases the common layer can even be doped or processed differently for the 1T1R array as compared with the 1TnR array, though the common layer is initially formed from a single material. In at least one embodiment, a suitable combination of the foregoing can be provided.

According to one or more disclosed embodiments, there is provided a method of fabricating a memory apparatus. The method can comprise providing a substrate for the memory apparatus comprising a plurality of MOS devices formed in the substrate. Additionally, the method can comprise forming a first back-end-of-line (BEOL) layer overlying the substrate, and forming a first one-transistor, multiple resistor (1TnR) device layer from a first portion of the first BEOL layer. The method can also comprise forming a first one-transistor, one-resistor (1T1R) device layer from a second portion of the first BEOL layer and forming a second BEOL layer. Further to the above, the method can comprise forming a second 1TnR device layer from a first portion of the second BEOL layer and forming a second 1T1R device layer from a second portion of the second BEOL layer.

In additional embodiments, the subject disclosure provides a memory apparatus. The memory apparatus can comprise a substrate having a plurality of metal oxide semiconductor (MOS) devices formed therein. Further, the memory apparatus can comprise a first set of backend memory layers, comprising at least a first subset of the backend memory layers and a second subset of the backend memory layers and a one-transistor, one-resistor (1T1R) resistive memory cell array formed within the first subset of the backend memory layers at least in part from the first set of backend memory layers. Moreover, the memory apparatus can comprise a one-transistor, multiple-resistor (1TnR, where n is greater than 1) resistive memory cell array formed within the second subset of the backend memory layers at least in part from the first set of backend memory layers and a first set of interconnects coupling the 1T1R resistive memory cell array to a first of the plurality of MOS devices formed in the substrate. In one or more embodiments, the memory apparatus can additionally comprise a second set of interconnects connecting the 1TnR resistive memory cell array to a second of the plurality of MOS devices formed in the substrate, wherein the 1T1R resistive memory cell array and the 1TnR resistive memory cell array are fabricated in part from at least one common layer of the first set of backend memory layers.

In one or more other embodiments, there is provided an integrated circuit. The integrated circuit can comprise a substrate comprising a plurality of metal oxide semiconductor (MOS) devices formed at least in part within the substrate and a set of back end of line layers configured in part to electrically interconnect two or more of the plurality of MOS devices. In addition, the integrated circuit can comprise a first array of two-terminal memory devices formed among a first subset of the back end of line layers, wherein the first array of two-terminal memory devices is formed in a 1TnR array architecture. Furthermore, the integrated circuit can comprise a second array of two-terminal memory devices formed among a second subset of the back end of line layers, wherein the second array of two-terminal memory devices is formed in a 1T1R array architecture, and wherein the first and second subsets of back end of line layers share a common back end of line layer of the set of back end of line layers.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects, and advantages of the instant invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, or materials. In other instances, well-known structures and devices are shown in block diagram form to facilitate describing the subject disclosure.

DETAILED DESCRIPTION

Figure 1:
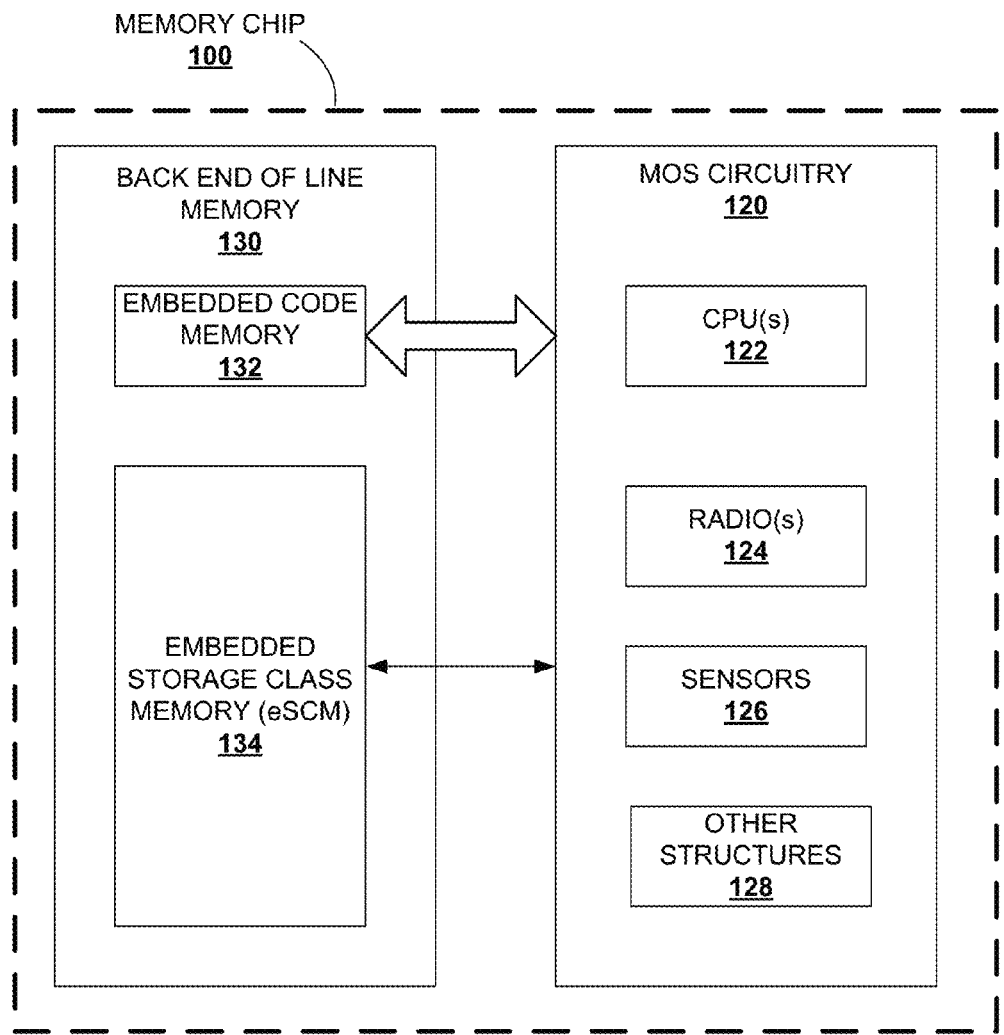
FIG. 1 depicts a block diagram of an example memory chip comprising code memory and storage class memory (SCM) in backend layers, in an embodiment.

This disclosure relates to two-terminal memory cells employed for digital or multi-level information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having conductive contacts with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, an electric or magnetic field, or the like, or a suitable combination thereof. An example of a resistive switching two-terminal memory device, though not exhaustive, can include a resistive random access memory (RRAM). In some embodiments, other resistive switching two-terminal memory devices may be suitable, such as phase-change RAM (PCRAM), magnetic RAM (MRAM), conductive-bridging RAM (CBRAM), or the like.

Embodiments of the subject disclosure can provide a filamentary-based memory cell. In some embodiments, the filamentary-based memory cell includes a non-volatile memory device, whereas other embodiments provide a volatile selector device (e.g., in electrical series with the non-volatile memory device). In further embodiments, both the volatile selector device and the non-volatile memory device can be filamentary-based devices, though the subject disclosure is not limited to these embodiments.

One example of a filamentary-based device can comprise: a conductive layer, a resistive switching layer (RSL) and an active metal capable of being ionized. Under suitable conditions, the active metal layer can provide filament forming ions to the RSL. In such embodiments, a conductive filament (e.g., formed at least in part by the ions) can facilitate electrical conductivity through at least a subset of the RSL, and a resistance of the filament-based device can be determined by a tunneling resistance (or, e.g., ohmic contact resistance) between the filament and the conductive layer. To reverse electrical conductivity resulting from the conductive filament, whether for the volatile selector device or the non-volatile memory device (with the exception of one-time programmable memory devices), the filament can be deformed. In some embodiments, deformation of the filament can comprise the particles (e.g., metal ions)—trapped within the defect locations—becoming neutral particles (e.g., metal atoms) in absence of the bias condition that have a high electrical resistance. In other embodiments, deformation of the filament can comprise dispersion (or partial dispersion) of the particles within the RSL, breaking a conductive electrical path provided by the filament in response to the bias condition. In still other embodiments, deformation of the filament can be in response to another suitable physical mechanism, or a suitable combination of the foregoing.

Generally, deformation of a conductive filament results from a change in the bias conditions to a second set of bias conditions. The second set of bias conditions can vary for different devices. For instance, deformation of a conductive filament formed within the volatile selector device can be implemented by reducing an applied bias below a formation magnitude (or small range of magnitudes, such as a few tens of a volt) associated with filament formation within the volatile selector device. Depending on the embodiment, a conductive filament can be created within a volatile selector device in response to a positive bias (e.g., forward bias) or in response to a negative bias (e.g., reverse bias), and deformation of the filament can occur in response to a suitable lower-magnitude positive bias or a suitable lower-magnitude negative bias, respectively. See U.S. patent application Ser. No. 14/588,185 filed Dec. 31, 2014 commonly owned by the assignee of the present application, and hereby incorporated by reference herein in its entirety and for all purposes. In contrast, deformation of a conductive filament formed within the non-volatile memory device can be implemented by providing a suitable erase bias (e.g., a reverse bias), having opposite polarity from a program bias (e.g., forward bias) utilized to form the conductive filament within the non-volatile memory device.

The conductive layer of the filamentary-based device can be a bottom electrode in some embodiments, and can comprise e.g., a metal, a conductive metal compound (e.g., TiN, TaN, TiW, etc.), a doped silicon (Si) bearing layer (e.g., p-type or n-type polysilicon, p-type or n-type polycrystalline SiGe, and so forth). The conductive layer is not limited to any vertical or spatial orientation however, and though by example is referenced above as a bottom electrode, in other embodiments the conductive layer can simply be a first electrode having any suitable spatial orientation relative to other components of the filamentary-based device. In various embodiments, the conductive layer can comprise TiN, TaN, or W, among other suitable electrically conductive materials selected, for instance, for compatibility with a fabrication process or a set of fabrication constraints (e.g., thermal budget, metallization scheme, photolithographic toolset, etching chemistry, etc.).

The RSL (which can also be referred to in the art as a resistive switching media (RSM)) can comprise, for example, an undoped amorphous Si layer, a semiconductor layer having intrinsic characteristics, a silicon nitride (e.g., SiN, $Si_3N_4$, $SiN_x$, etc.), a Si sub-oxide (e.g., $SiO_x$ wherein x has a value between 0.1 and 2), a Si sub-nitride, a non-stoichiometric oxide, a non-stoichiometric nitride, a metallic oxide (e.g. Zinc Oxide, among others), a metallic nitride (e.g., AN, etc.) and so forth. Other examples of materials suitable for an RSL, depending on the embodiment, could include $Si_XGe_YO_Z$ (where X, Y, and Z are respective suitable positive integers), a silicon oxide (e.g., $SiO_N$, where N is a suitable positive integer), amorphous Si (a-Si), amorphous SiGe (a-SiGe), $TaO_B$ (where B is a suitable positive integer), $HfO_C$ (where C is a suitable positive integer), $TiO_D$ (where D is a suitable positive integer), $Al_2O_E$ (where E is a suitable positive number), and so forth, or a suitable combination thereof. For a volatile selector device, the RSL can be configured to have few or no voids or defects that could trap or hold particles (e.g., particles of the active metal layer). Accordingly, the RSL of the selector device can require maintenance of an external stimulus to keep a conductive filament in place. For the non-volatile memory device, the RSL can be configured to have suitable concentration(s) (or concentration gradient(s)) of voids or defects to trap or hold particles in place, in the absence of an external program stimulus causing the particles to drift within the RSL, and form the conductive filament. For the non-volatile memory device then, the particles can remain trapped in the absence of the external program stimulus, requiring a suitable reverse bias (e.g., a negative polarity erase stimulus) to drive the particles out of the voids/defects, or otherwise break continuity of the conductive filament, thereby deforming the conductive filament.

In some embodiments, a contact material layer can be disposed between the conductive layer and the RSL. The contact material layer can be comprised of any suitable conductor, such as a conductive metal, a suitably doped semiconductor, or the like. Where utilized, the contact material layer can be employed to provide good ohmic contact between the RSL and a metal wiring layer (e.g., the conductive layer, if coincident with the metal wiring layer) of an associated memory architecture. In some embodiments, the contact material layer can be removed and the RSL can be in physical contact with the metal wiring layer/conductive layer. Suitable metal wiring layers can include copper, aluminum, tungsten, platinum, gold, silver, or other suitable metals, suitable metal alloys, metal compounds, or combinations of the foregoing. In at least one embodiment, the metal wiring layer can instead be a conductive Si wiring layer (rather than metal). In further embodiments, a diffusion mitigation layer or adhesion layer can be provided between the RSL and the metal wiring layer (or between the RSL and the contact material layer).

Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials (e.g., conductive metal oxide, conductive metal nitride, etc.) can be employed for the active metal layer in some aspects of the subject disclosure. In some embodiments, a thin layer of barrier material composed of Ti, TiN, or the like, may be disposed between the RSL and the active metal layer (e.g., Ag, Al, $AlN_y$, where y is a suitable positive integer, and so on). Details pertaining to additional embodiments of the subject disclosure similar to the foregoing example(s) can be found in the following U.S. patent applications that are licensed to the assignee of the present application for patent: application Ser. No. 11/875,541 filed Oct. 19, 2007, application Ser. No. 12/575,921 filed Oct. 8, 2009, and the others cited herein, each of which are incorporated by reference herein in their respective entireties and for all purposes.

In response to a suitable program stimulus (or set of stimuli) a conductive path or a filament of varying width and length can be formed within a relatively high resistive portion of a non-volatile memory device (e.g., the RSL). This causes a memory cell associated with the non-volatile memory device to switch from a relatively high resistive state, to one or more relatively low resistive states. In some resistive-switching devices, an erase process can be implemented to deform the conductive filament, at least in part, causing the memory cell to return to the high resistive state from the low resistive state(s), as mentioned previously. This change of state, in the context of memory, can be associated with respective states of a binary bit or multiple binary bits. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in respective memory cells.

According to various disclosed embodiments, disclosed resistive switching devices can be fabricated consistent with foundry compatible processes. As utilized herein, foundry compatible refers to consistency with physical, material or process constraints (or a combination thereof) associated with fabrication of a semiconductor-based device in a commercial semiconductor fabrication foundry, such as Taiwan Semiconductor Manufacturing Corporation, among others. Physical constraints include a thermal budget (e.g., maximum operating temperature) of a die, and of materials and metals constructed on the die prior to a given process step. For example, where a die comprises one or more metal layers or constructs, and viability of device models require the metal layers to maintain tight position tolerance, the thermal budget may be set by the softening temperature of the metal(s) to avoid loss of metal rigidity. Other constraints can include, CMOS, nMOS or pMOS fabrication constraints, where applicable, fabrication toolset limitations of a particular metallization scheme (e.g., etching/masking/grooving toolsets available for Aluminum, Copper, etc.), etching, grooving or cleaning chemistry compatible with the metallization scheme or with a set of dielectric materials, physical properties requiring special process handling (e.g., dispersion properties of Cu, oxidation properties of metals, semi-conducting materials, etc.), or the like, or other constraints of commercial foundry. Accordingly, the phrase "foundry compatible" implies consistency with process limitations of at least one commercial semiconductor fabrication foundry.

Thermal budget refers to an amount of thermal energy transferred to a wafer during a particular temperature operation. During the process of manufacturing the resistive memory, for example, there is a desire to not adversely affect complementary metal oxide semiconductor (CMOS) devices by application of excess heat, or the like. Accordingly, CMOS devices within a substrate can impose a thermal budget constraint to the manufacture of memory components upon a CMOS chip or substrate (e.g., by way of a backend of line fabrication process). Likewise, thermal budget constraints should be considered during the manufacture of a resistive memory device in an integrated circuit, for instance.

An integrated circuit (IC) foundry includes various equipment and processes that are leveraged in order to incorporate the resistive memory into the backend of line process. The inventors of the present disclosure are familiar with backend material compatibility issues associated there with. The one or more disclosed aspects can perform the process of fabricating the resistive memory device in a relatively simple manner compared to other resistive memory fabrication processes. For example, a common material(s), or common process step(s) can be employed in fabricating differently configured memory arrays (e.g., 1T1R, 1TnR) disclosed herein.

Further, one or more disclosed aspects can enable smaller die sizes and lower costs through one or more disclosed processes for monolithic integration of resistive memory onto a product of a frontend of line process (e.g., a MOS substrate, including CMOS, nMOS, or pMOS devices). Further, the fabrication of the resistive memory devices may be performed using standard IC foundry-compatible fabrication processes. Various embodiments can also be implemented without design changes after monolithic integration (e.g., over a CMOS device) to account for changes in parasitic structure. A parasitic structure is a portion of the device (e.g., memory device) that resembles in structure a different semiconductor device, which might cause the device to enter an unintended mode of operation. Further, in at least one disclosed embodiment, there is provided a product (e.g., a memory device) of a fabrication process that can incorporate monolithic integration of resistive memory over a CMOS circuitry. Further, the fabrication process can comprise IC foundry-compatible processes in a further embodiment (e.g., new or different processes are not necessary, though in alternative embodiments future improvements to such processes may be within the scope of various aspects of the present disclosure). In addition, the disclosed aspects can be performed within a thermal budget of front-tend of line devices.

The present disclosure provides for a monolithic memory structure having multiple arrays of resistive-switching memory with different array configurations. Moreover, the array configurations can be separately constructed to have different characteristics suitable for different device functions. For instance, a first array configuration can provide high-speed and high efficacy 1T1R memory, which can be utilized as code memory or other high-speed non-volatile memory function. As another example, a second array configuration can provide high-density 1TnR memory (where n is a suitable integer greater than 1) as an embedded storage class memory (eSCM). Thus, in one embodiment, a monolithic memory structure can be provided with resistive-switching code memory having a first set of characteristics, as well as resistive-switching eSCM having a second set of characteristics.

The subject disclosure further provides fabrication techniques for mitigating process cost and complexity related to manufacture of a monolithic memory structure. The general assumption in semiconductor fabrication is to form different components on different sections of a chip with different processes. For instance, a conventional fabrication technique might pattern and etch logic arrays in one segment of a chip first, followed by a memory array in a second segment of the chip, and then followed by interconnects and other electrical connectors in a third segment of the chip, and so on. Extending conventional techniques to disclosed monolithic memory structures having different array configurations would suggest fabricating respective array configurations in sequential process steps. However, various disclosed embodiments utilize a common material layer for at least a subset of differently configured arrays. Further embodiments can utilize common material processing steps (e.g., deposition, patterning, etching, doping, annealing, oxidizing, etc.) for subsets of differently configured arrays.

Referring now to the drawings, FIG. 1 illustrates a block diagram of an example memory chip 100 according to one or more disclosed embodiments. In some embodiments, memory chip 100 can be a monolithic construct formed over a single substrate. In other embodiments, memory chip 100 can comprise one or more monolithic devices comprising respective components of memory chip 100, bonded together to form memory chip 100. The description hereafter will generally presume the monolithic construct, but one of ordinary skill in the art would appreciate that the following descriptions can be applicable to non-monolithic devices, where suitable.

Memory chip 100 can comprise metal oxide semiconductor (MOS) circuitry 120 and back-end-of line memory 130. MOS circuitry can include complementary metal oxide semiconductor (CMOS) devices, as well as nMOS and pMOS devices, in various embodiments, or suitable combinations of the foregoing. MOS circuitry 120 can be formed at least in part within a substrate of memory chip 100, and can include one or more central processing units (CPUs), a wireless radio(s) 124, one or more sensors 126, as well as other structures 128 (e.g., interconnects, wiring layouts, a memory controller, active components, passive components, and so on).

MOS circuitry 120 can be electrically connected with at least a subset of back end of line memory 130. Back end of line memory 130 is generally constructed above a substrate of memory chip 100. Examples of back end of line fabrication of a memory array (in addition to those disclosed herein) can be found with reference to the following: U.S. patent application Ser. No. 14/587,711 filed Dec. 31, 2014, U.S. patent application Ser. No. 14/588,136 filed Dec. 31, 2014, U.S. patent application Ser. No. 14/613,585 filed Feb. 4, 2015, U.S. patent application Ser. No. 14/194,499 filed Feb. 28, 2014, and U.S. patent application Ser. No. 14/588,202 filed Dec. 31, 2014; each of which are commonly owned by the assignee of the present application and hereby incorporated by reference herein in their respective entireties and for all purposes. Examples of back end of line process or fabrication techniques disclosed in the foregoing documents as well as those techniques included in the present disclosure can be utilized to form an embedded code memory 132 and an embedded storage class memory (eSCM) 134 in part or entirely within backend layers above a substrate of memory chip 100.

Back end of line memory 130 can be fabricated over an insulating layer, above the substrate, as well as over at least a subset of MOS circuitry 120 in some embodiments. For instance, components of MOS circuitry 120 can be formed partially or entirely within the substrate, whereas other components of MOS circuitry 120 (e.g., a gate oxide, a gate layer, metal interconnects, among others) can be formed at least in part above the substrate. It should be appreciated that in at least some disclosed embodiments, one or more layers employed for embedded code memory 132 or eSCM 134 can also be employed at least in part by MOS circuitry 120. That is, a component of MOS circuitry 120 can be constructed in a common layer with a component of embedded code memory 132 or eSCM 134 in such embodiments. In alternative embodiments, embedded code memory 132 and eSCM 134 are formed within layers that are separate from and exclusive of the layers in which MOS circuitry 120 are formed.

Embedded code memory 132 can be formed as a one transistor-one resistive (1T1R) memory array in various disclosed embodiments. The 1T1R memory array can comprise a single resistive memory cell (e.g., comprising a non-volatile memory device, optionally in electrical series with a volatile selector device) that is connected to a single transistor. In some embodiments, the single transistor can be a subset of MOS circuitry 120, and the single resistive memory cell can be a subset of embedded code memory 132, with a conductive interconnect there between. In at least one embodiment, the single transistor can also be a back end of line device (built above a substrate of memory chip 100). The 1T1R memory array has the advantage of fast performance, good memory retention and longevity, and high on/off current ratio, suitable for high-speed execution of code or application instructions by CPU(s) 122. For instance, 1T1R memory can have access times in the tens of nanoseconds (e.g., about 50 nanoseconds), and read times in the hundreds of nanoseconds, as one example. Additionally, embedded code memory 132 can have a relatively large bus (e.g., 32-bit bus, 64-bit bus, etc.) for large data throughputs.

eSCM 134 can be formed as a one transistor-multiple resistor (1TnR, where n is a suitable integer greater than 1) memory array in further embodiments. The multiple resistors can, respectively, be two-terminal, resistive memory cells (e.g., as described above). Resistive memory cells can generally be constructed as very small entities, scalable to 20 nm devices and even below (e.g., to 14 nm, 7 nm, 5 nm, and so on). Accordingly, many resistive memory cells can be constructed in a relatively small volume of chip space, allowing for great densities, when not limited by interconnections to other larger components (e.g., CMOS transistors). Though eSCM 134 can have slower switching times and access times than embedded code memory 132 (e.g., on an order of a few microseconds or tends of microseconds, as compared with tens or hundreds of nanoseconds) very high memory densities, as large as multiple terabytes, can be achieved for a single memory chip 100 (e.g., 1 terabyte, 2 terabytes, 4 terabytes, 8 terabytes, or even larger memory densities are possible, depending on device node size). Further, eSCM 134 can have a standard data bus (e.g., 8-bit bus, etc.) to communicate with external storage-class memory controllers, in an embodiment. In other embodiments, eSCM 134 can have a non-standard or proprietary data bus to communicate with specialized controllers, or internal structures (e.g., CPU(s) 122, embedded code memory 132, etc.) with a non-standard, specialized or dedicated bus.

By combining embedded code memory 132 with eSCM 134, the advantages of both 1T1R and 1TnR memory technologies can be provided in a single memory chip 100. Moreover, in some disclosed embodiments, at least a subset of embedded code memory 132 and eSCM can be constructed with common material layers or processing steps. For instance, where eSCM 134 and embedded code memory 132 each comprise resistive memory cells, respective electrodes for the arrays (and electrode layers), or respective resistance switching materials (or respective barrier layers, adhesion layers, contact layers, etc.) can be provided with a common material or a common processing step. In further embodiments, one or more layers or processing steps can be provided for one of the memory arrays, but not the other. For instance, a set of volatile selector devices can be fabricated in electrical series with respective non-volatile memory devices only for a 1TnR array of eSCM 134, but not for the 1T1R array of embedded code memory 132. Additionally, a set of vertical interconnects connecting respective resistive memory cells of the 1T1R array to respective transistors of the 1T1R memory array can be fabricated for embedded code memory 132, whereas far fewer vertical interconnects are provided for 1TnR array of eSCM 134.

Figure 2:
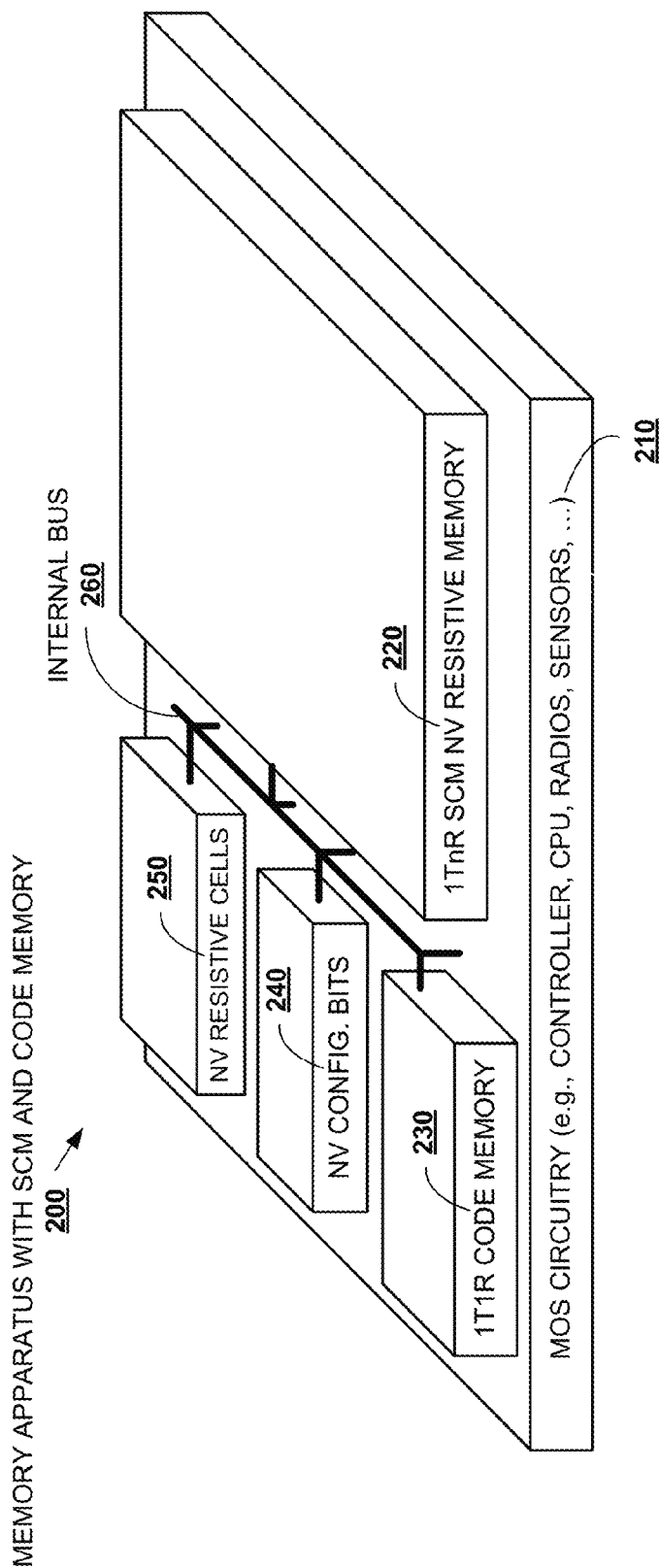
FIG. 2 depicts a block diagram of a sample monolithic memory device having backend code and SCM memory operable with MOS circuitry in an embodiment.

FIG. 2 illustrates a block diagram of an auxiliary view of a memory apparatus 200 according to further embodiments of the present disclosure. The memory apparatus 200 can comprise a memory controller having both code memory and eSCM memory, in various embodiments. As illustrated, a substrate 210 is provided in which MOS circuitry can be formed. The MOS circuitry can comprise a memory controller(s), a CPU(s), a radio(s), and one or more sensors, as well as other suitable front end of line electronic components, logic components, interconnects, and the like.

Over substrate 210 are a set of back end of line components and devices. For instance, a SCM resistive memory 220 is provided, comprising a 1TnR array of non-volatile resistive memory cells. 1TnR array can have an n of 1000, 10,000, 100,000 or even greater in various embodiments (or suitable integers there between), achieving quite high memory densities. Additionally, memory apparatus 200 can comprise a 1T1R code memory 230 for executing code or applications instructions. 1T1R code memory 230 can fast high access times (e.g., in a range from about 5 nanoseconds to about 50 nanoseconds), high data throughputs, and the like.

In further embodiments, memory apparatus 200 can comprise a set of non-volatile configuration bits 240 for programming memory apparatus 200 to one of a set of operational configurations. Non-volatile configuration bits 240 can store device settings, controller parameters, or other suitable information associated with initializing or loading operational code of memory apparatus 200 (e.g., see U.S. Pat. No. 8,674,724 entitled Field Programmable Gate Array Utilizing Two-Terminal Non-Volatile Memory issued Mar. 18, 2014, assigned to the assignee of the present Application for Patent, and hereby incorporated by reference herein in its entirety and for all purposes). Non-volatile configuration bits 240 can facilitate rapid shut-down and start-up of memory apparatus 200, enabling frequent shut-down, sleep, or other power saving operations. In some embodiments, non-volatile configuration bits 240 can facilitate shut-down or start-up within a period ranging from a few hundred nanoseconds to a few microseconds, enabling shut-down and start-up for a portion of a clock cycle. Thus, non-volatile configuration bits 240 can enable memory apparatus 200 to conserve significant power and extending operational life.

In still other embodiments, memory apparatus 200 can comprise non-volatile resistive cells 250. Non-volatile resistive cells 250 can be configured as a node retainer circuit comprising resistive memory cells, as one example. In one or more embodiments, non-volatile resistive cells 250 can be configured as a non-volatile data-backup for a volatile memory (e.g., SRAM, DRAM, etc.—not depicted) or volatile state change circuits (e.g., data latch circuit, and so forth—not depicted). Examples of non-volatile resistive cells 250 can be found in U.S. Provisional Application Ser. No. 62/111,632 filed Feb. 3, 2015, which is owned by the assignee of the present application and hereby incorporated by reference herein in its entirety and for all purposes. The resistive memory cells of non-volatile resistive cells 250 can be fabricated monolithically in conjunction with other components of memory apparatus 200. In at least one embodiment, resistive memory cells of non-volatile resistive cells 250 can be formed with at least one common material layer as 1T1R code memory 230, or SCM resistive memory 220.

Memory apparatus 200 can further comprise an internal bus 260. Internal bus 260 can be configured to facilitate communication between one or more components of memory apparatus 200. Thus, for instance, internal bus 260 can provide communication between back end of line components (e.g., SCM resistive memory 220, 1T1R code memory 230, non-volatile configuration bits 240, non-volatile resistive cells 250) and MOS circuitry on substrate 210 in some embodiments (e.g., a memory controller, CPU, radio(s), sensor(s), and so on). In other embodiments, internal bus 260 can provide communication between back end of line components of memory apparatus 200. Internal bus 260 can comprise a connection two or more backend memory components of memory apparatus 200, and can comprise suitable CMOS circuitry to facilitate communication between the two or more backend memory components. In an embodiment, internal bus 260 can comprise multiple bus structures for respective subsets of the back end of line components. As one example internal bus 260 can comprise a 32-bit or 64-bit bus for 1T1R code memory 230, and an 8-bit or 16-bit bus for SCM resistive memory 220.

Memory apparatus 200 can be configured to meet various applications or functions. For instance, memory apparatus 200 can be a standalone micro-electronic device having no external 110 connections, in an embodiment. This can facilitate a highly secure device resistant or immune to corruption over an interconnect port, for example. Additionally, internal bus(ses) 260 (e.g., utilizing CMOS circuitry within substrate 210 and interconnections between a backend memory(ies) and the substrate 210) can provide high performance with wide internal bus-widths, in one or more embodiments. Further, resistive memory cells for various back end of line components can be constructed with some or all common layers, greatly simplifying manufacture of memory apparatus 200.

Figure 3:
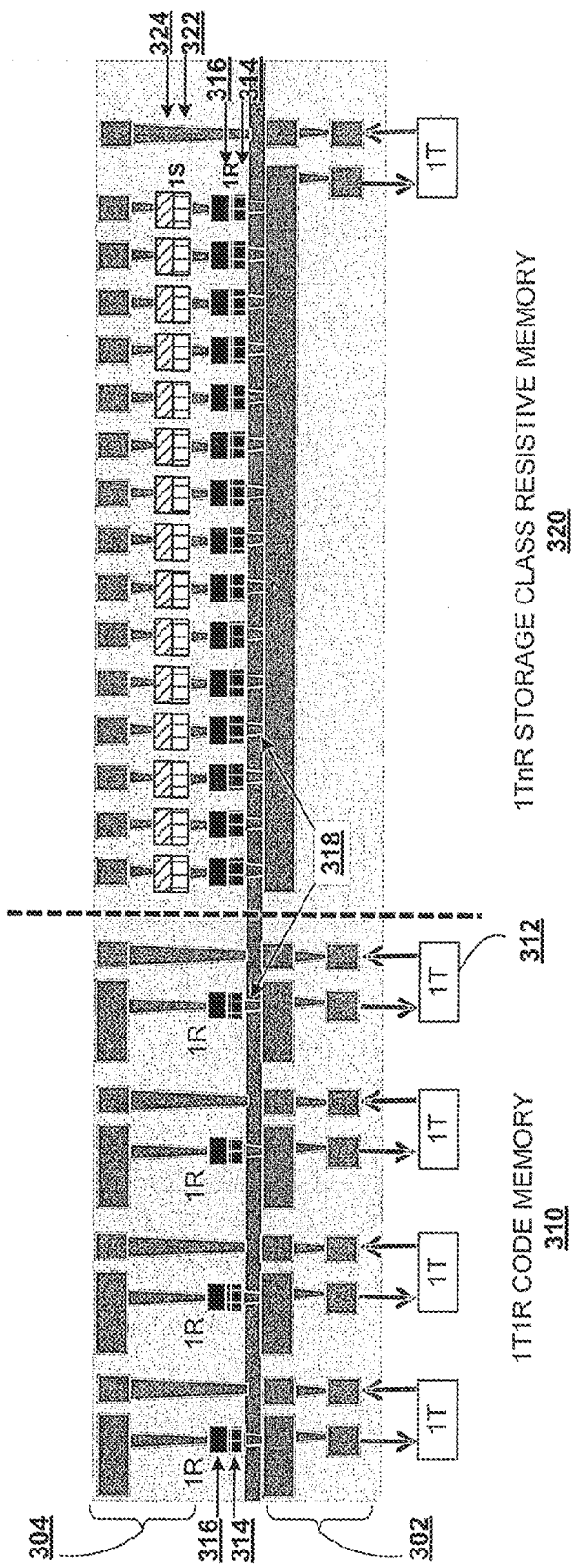
FIG. 3 illustrates a side view of an example stack of material layers for a memory device comprising code memory and SCM in backend layers.

FIG. 3 illustrates a block diagram of a cross section view of a set of memory device layers 300 in an embodiment(s). Memory device layers 300 can be constructed over a substrate (not depicted) and suitably insulated by one or more electrical insulating layers (e.g., gray material in the background of memory device layers 300). A set of transistors 312 are formed in the substrate, with a first (e.g., lower) set of interconnect layers 302 above the substrate. First set of interconnect layers can comprise electrical contacts between respective ones of set of transistors 312, and one or more memory cells fabricated above first set of interconnect layers 302. On a left side of memory device layers 300 is a 1T1R code memory 310, and on a right side of memory device layers 300 is a 1TnR storage class resistive memory 320. As implied by the descriptive name, the 1T1R code memory 310 comprises interconnects between respective ones of transistors 312 and respective memory cells of 1T1R code memory 310. In contrast, a single transistor 312 is connected to a large number of (densely packed) memory cells in 1TnR storage class resistive memory 320.

As described herein, 1T1R code memory 310 and 1TnR storage class resistive memory can comprise non-volatile memory cells having at least one common layer. This results in simplified manufacturing, reducing process complexity and fabrication costs. As illustrated by FIG. 3, 1T1R code memory 310 and 1TnR storage class resistive memory 320 can have a first common layer 314 and a second common layer 316. First common layer 314 and second common layer 316 can be a conductive layer, such as a metal layer, metal alloy layer, doped semiconductor layer, or the like, an insulating layer (e.g., an oxide, . . . ), a barrier layer, an adhesion layer, a diffusion mitigation layer, an ohmic contact layer, an RSL, or the like, or a suitable combination of the foregoing. In at least one embodiment, first common layer 314 can provide an RSL for memory cells of 1T1R code memory 310 and for 1TnR storage class resistive memory 320, and second common layer 316 can provide sets of top electrodes for 1T1R code memory 310 and 1TnR storage class resistive memory 320, although the subject disclosure is not limited to this embodiment.

Further to the above, one or more of 1T1R code memory 310 and 1TnR storage class resistive memory 320 can have at least one non-common layer. For instance, 1TnR storage class resistive memory 320 can comprise a set of volatile selector devices (1S) formed from first non-common layer 322 and second non-common layer 324 (although additional layers may be utilized to form non-volatile selector devices, in various embodiments).

A second set (e.g., upper) of interconnect layers 304 can be formed to respectively connect 1T1R code memory 310 and 1TnR storage class resistive memory 320 to metal layers (e.g., a bitline, a wordline, a source line, a data line, or the like) above the memory arrays. As depicted, interconnects for 1TnR storage class resistive memory 320 can be much more densely packed than associated interconnects for 1T1R code memory 310.

Figure 4:
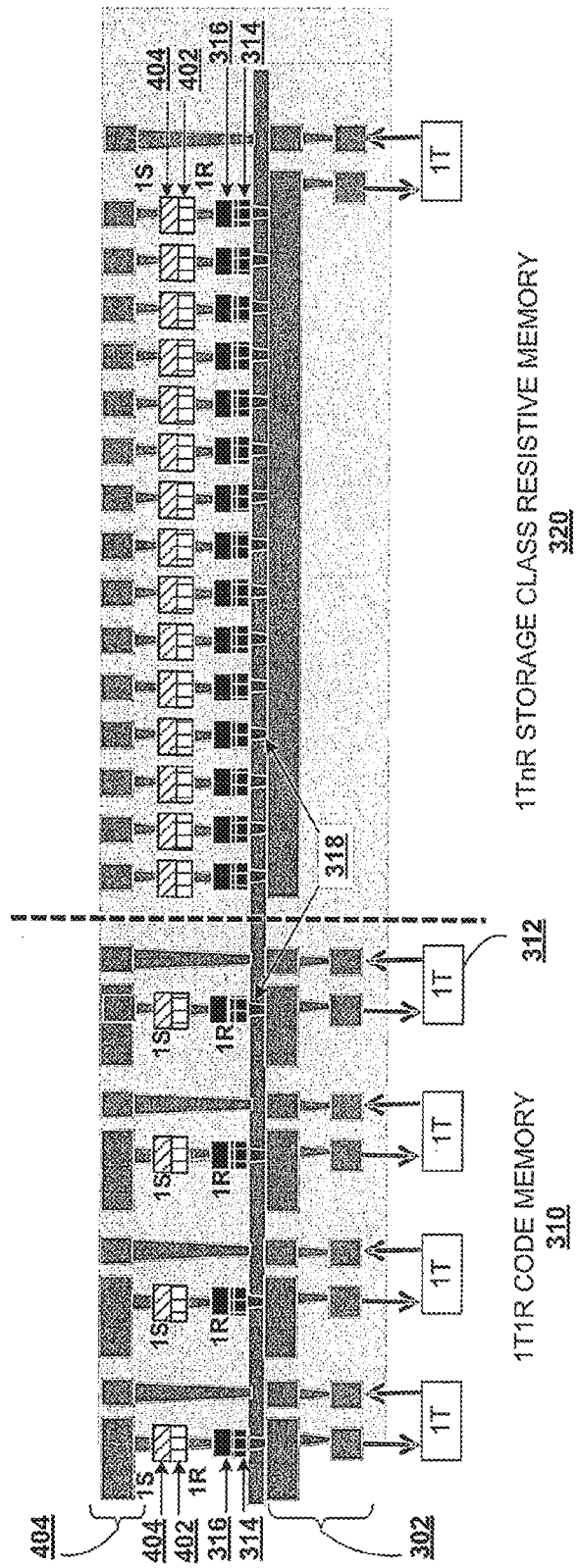
FIG. 4 depicts a side view of a sample stack of material layers for a memory device in an additional embodiment.

FIG. 4 illustrates a block diagram of a sample cross section view of memory device layers 400 according to further disclosed embodiments. In the embodiment(s) depicted by memory device layers 400, 1T1R code memory 310 can comprise a set of volatile selector devices (that can also be referred to as 1T1S1R code memory), formed above respective non-volatile memory cells of 1T1R code memory 310. Thus, the first non-common layer 322 and second non-common layer 324 of FIG. 3, supra, can instead be shared between 1TnR storage class resistive memory 320 and 1T1R code memory 310, resulting in a third common layer 402 and a fourth common layer 404, in addition to first common layer 314 and second common layer 316. In an embodiment, third common layer 402 can provide a volatile RSL (e.g., having few or no voids or defects) and fourth common layer 404 can provide a top electrode for the sets of volatile selector devices. In other embodiments, a different arrangement of material layers, or additional material layers, can be provided to fabricate the volatile selector devices. In yet another embodiment, a first set of volatile selector devices associated with 1T1R code memory 310 can have at least one different layer from a second set of volatile selector devices associated with 1TnR storage class resistive memory 320. As one example, a different top electrode, a different bottom electrode, or a different volatile RSL can be provided for the respective sets of volatile selector devices.

First set of interconnect layers 302 can be substantially similar as those shown in FIG. 3, whereas a second set of interconnect layers 404 can electrically connect respective volatile selector devices of 1T1R code memory 310 and 1TnR storage class resistive memory 320 with metal lines above second set of interconnect layers 404, or other electronic devices.

Figure 5:
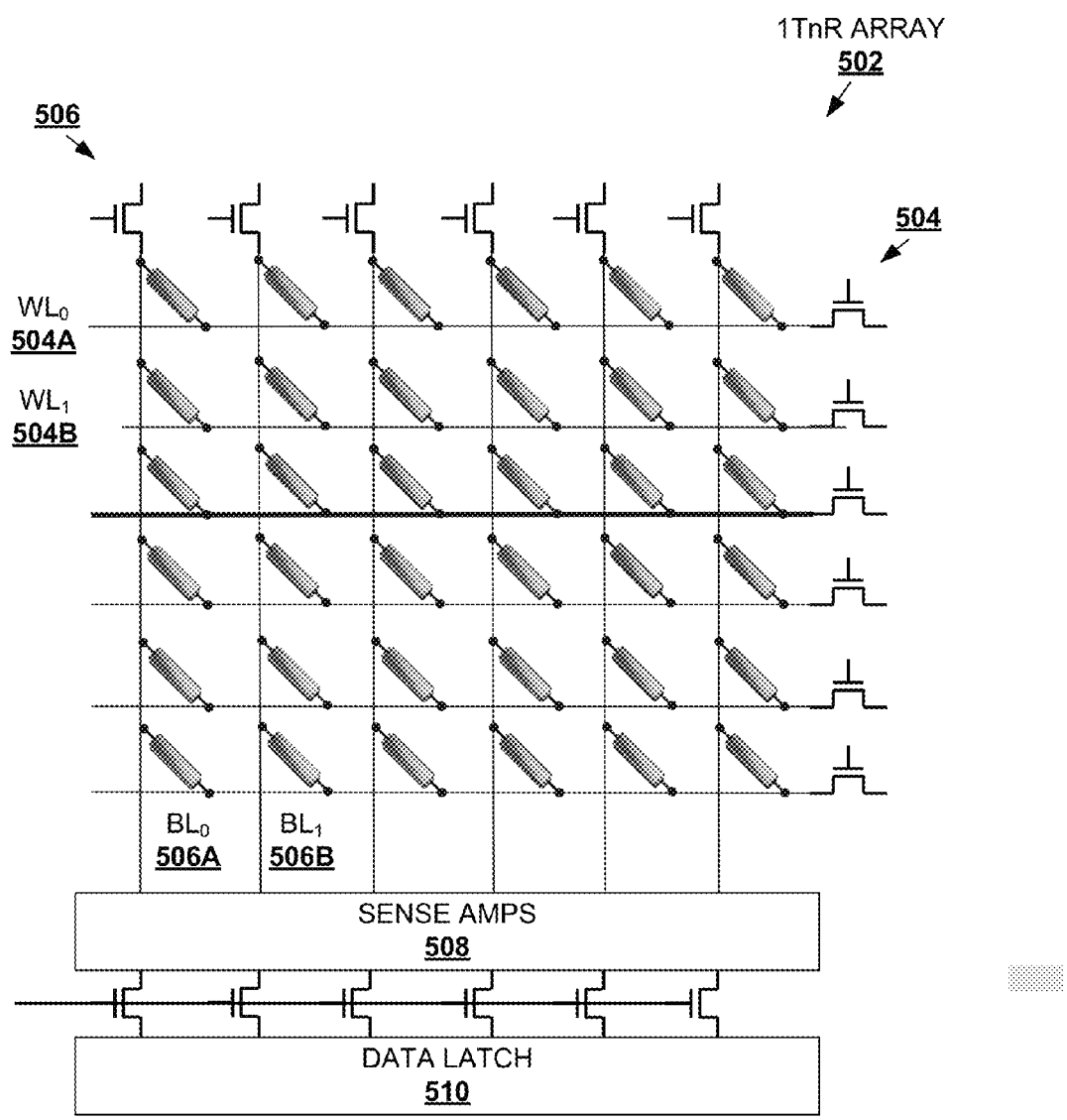
FIG. 5 illustrates a diagram of a sample 1TnR array for a disclosed memory device, in a further embodiment.

FIG. 5 illustrates a diagram of an example schematic layout 500 for a 1TnR memory array 502 according to further disclosed embodiments. 1TnR array 502 can comprise a set of wordlines 504 intersecting a set of bitlines 506. Signals, such as a bias voltage or a current, can be selectively applied to respective ones of bitlines 506, such as $BL0_0$ 506A or $BL_1$ 506B, or to respective ones of wordlines 504, such as $WL_0$ 504A or $WL_1$ 504B, to affect respective memory cells of 1TnR array 502. For read operations, a set of sense amps 508 can be employed to measure data values stored by a row of memory cells on 1TnR array 502. Further, a data latch 510 can be employed to temporarily store data to be read out from 1TnR array 502, or programmed into 1TnR array 502.

Figure 6:
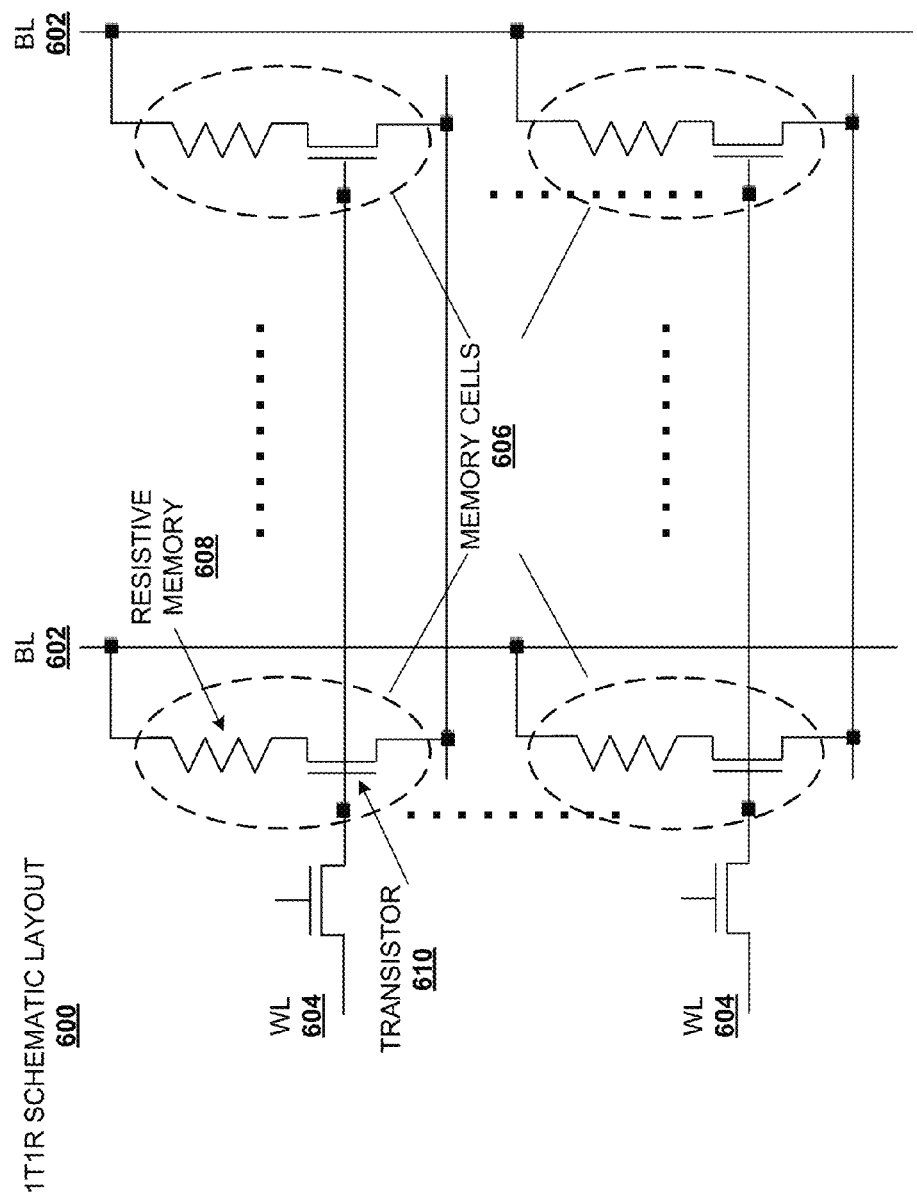
FIG. 6 depicts a schematic diagram of an example 1T1R memory structure in a further embodiment.

FIG. 6 illustrates a schematic diagram of an example 1T1R schematic layout 600 according to one or more embodiments. 1T1R schematic layout 600 can comprise a set of bitlines 602 intersecting a set of wordlines 604. An intersection of respective bitlines 602 and wordlines 604 can comprise a 1T1R memory cell 606. Such a memory cell 606 further comprises a non-volatile resistive memory cell 608 connected electrically in series to a transistor 610. In various embodiments, resistive memory cell 608 can be formed within back end of line memory layers, whereas transistor 610 can be formed at least in part on a substrate in front end of line memory layers.

Figure 7:
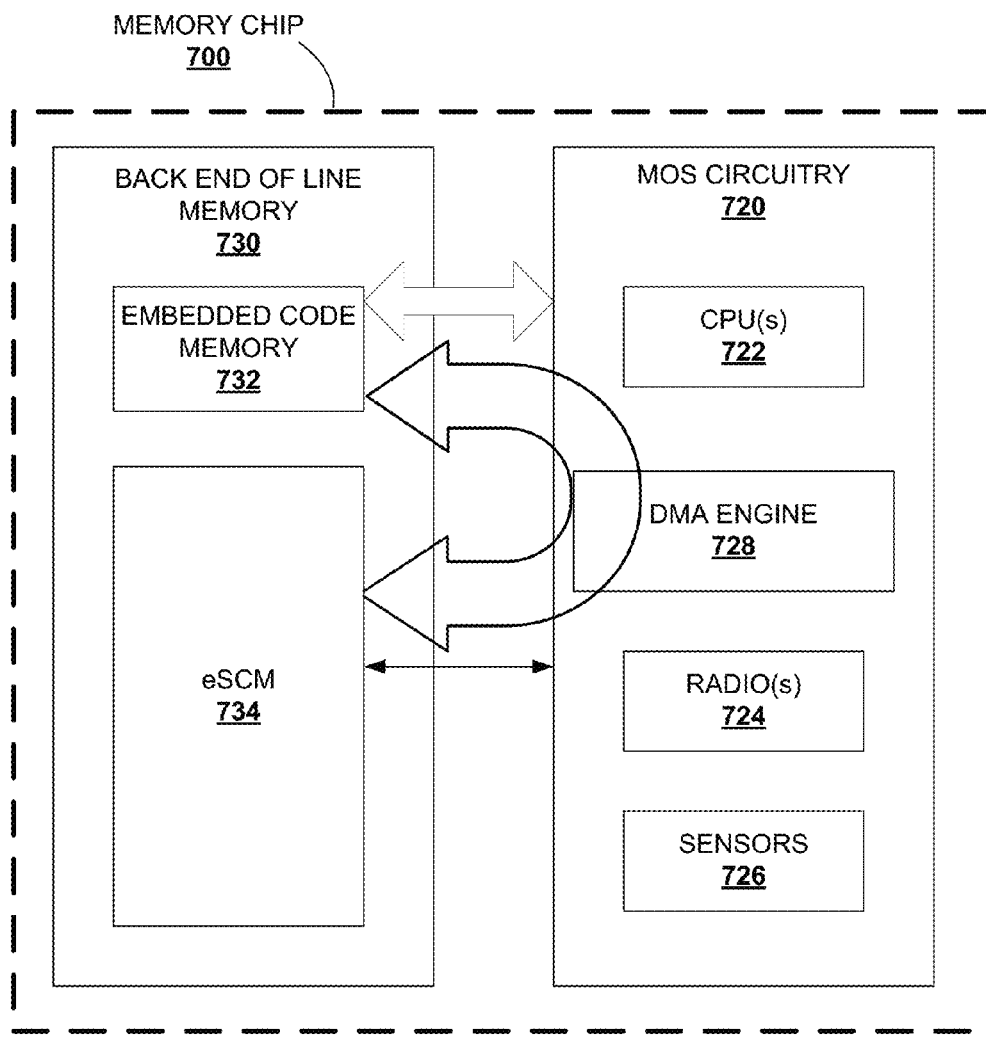
FIG. 7 illustrates a block diagram of a sample memory chip configured to transfer data from SCM to code memory, in a further embodiment.

FIG. 7 illustrates a block diagram of an example monolithic memory chip 700 according to further embodiments of the present disclosure. Memory chip 700 can be configured to facilitate direct memory access between an embedded code memory 732 and eSCM 734. This can facilitate access to greater storage densities for code memory, by offloading a subset of code, or application instructions to eSCM 734, which can be accessed by embedded code memory 732 when required to execute various code processes.

As depicted, memory chip 700 can comprise MOS circuitry 720 fabricated on a substrate and front end of line layers of memory chip 700. Additionally, back end of line memory 730 can be provided comprising the embedded code memory 732 and eSCM 734. MOS circuitry 720 can comprise a CPU(s) 722, a radio(s) 724 and one or more sensors 726. Additionally, MOS circuitry 720 can comprise a direct memory access (DMA) engine 728, configured to store data from embedded code memory 732 at eSCM 734, and further configured to retrieve data from eSCM 734 and provide the retrieved data to embedded code memory 732. Thus, although not separately depicted, DMA engine 728 can be connected to embedded code memory 732 via a command interface as well as a data interface. The command interface can be employed to issue data storage or data retrieval instructions to data engine 728, and the data interface can be employed to transfer data between embedded code memory 732 and DMA engine 728. Additionally, DMA engine 728 can be connected to eSCM 734 via a second data interface. Data received from embedded code memory 732 can be saved by DMA engine 728 at eSCM 734 (e.g., in response to a first command received over the command interface), and likewise, data requested by embedded code memory 732 can be retrieved from eSCM 734 and provided by DMA engine 728 to embedded code memory 732 (e.g., in response to a second command received over the command interface). DMA engine 728 facilitates communication between the high-speed code memory 732 and high density eSCM 734. High-speed code memory 732 comprising of 1T1R is typically not as dense as the eSCM 734 comprising of 1TnR. Therefore, in some embodiment of the invention, the eSCM 734 may include codes for execution and all or a portion of such code may be loaded from eSCM 734 to code memory 732. In other embodiments of the present disclosure, DMA engine 728 may be utilized to facilitate the inter-communication between the eSCM 734 and code memory 732.

Figure 8:
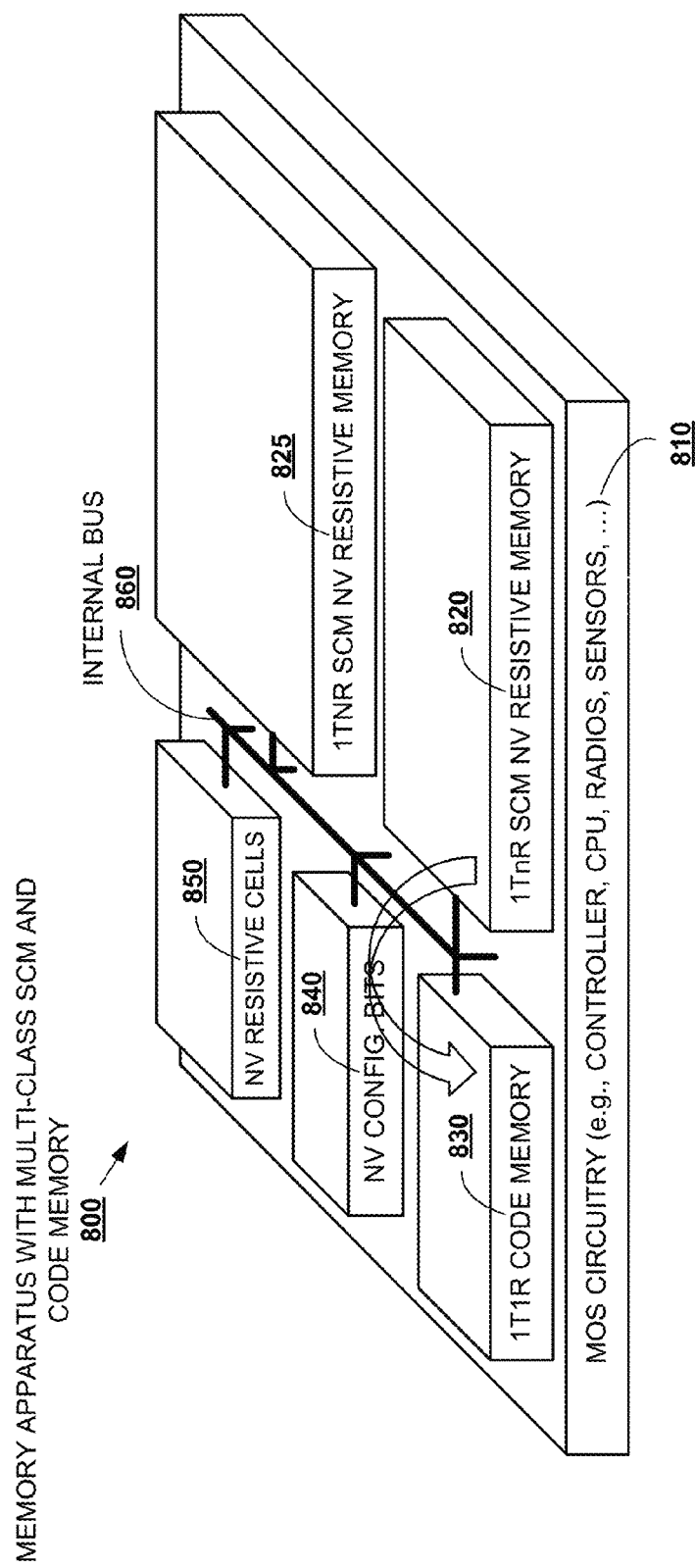
FIG. 8 depicts a block diagram of an example memory device having multiple types of SCM, in a further embodiment.

FIG. 8 illustrates a block diagram of an example memory apparatus 800 according to one or more additional embodiments of the present disclosure. Memory apparatus 800 can comprise a substrate 810 comprising MOS circuitry, such as a controller(s), CPU(s), radio(s), sensor(s), or the like. A 1T1R code memory 830 is provided, along with non-volatile configuration bits 840 and non-volatile resistive cells (which can be substantially similar to non-volatile configuration bits 840 and non-volatile resistive cells 250 of FIG. 2, supra). Additionally, memory apparatus 800 can comprise multiple classes of SCM, including 1TnR non-volatile resistive SCM 820, and 1TNR non-volatile resistive SCM 825, where N is a positive integer greater than 1, and where N≠n. Thus, memory apparatus 820 can have multiple classes of SCM, each with different memory densities. Additionally, the respective classes of SCM can be configured to have different performance characteristics (e.g., as a trade-off with memory density; however, the performance-density trade-off can be a linear or non-linear relationship in various embodiments). For instance, 1TnR non-volatile resistive SCM 820 can be configured to have an access time faster than 1TNR non-volatile resistive SCM 825 and slower than 1T1R code memory 830. Internal bus 860 can facilitate data transfer between 1TnR non-volatile resistive SCM 820 and 1T1R code memory 830 (e.g., via a DMA engine 728 of FIG. 7, supra).

Figure 9:
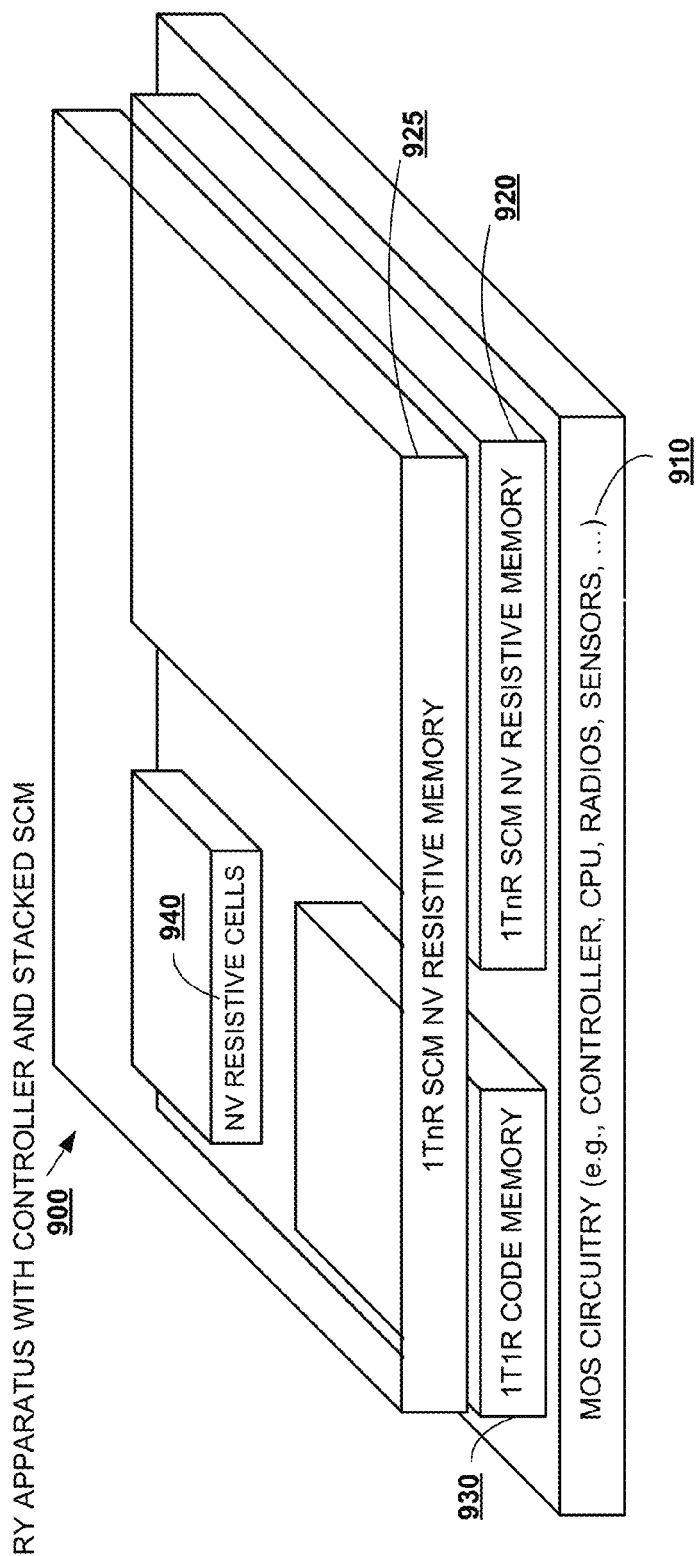
FIG. 9 illustrates a block diagram of a sample memory device comprising stacked layers of SCM, in an additional embodiment.

FIG. 9 illustrates a block diagram of an example memory apparatus 900 according to further disclosed embodiments. Memory apparatus 900 can comprise multiple arrays of storage class memory, stacked vertically within back end of line layers over a substrate of memory apparatus 900. It should be appreciated that memory apparatus 900 is a conceptual illustration; memory arrays overlying other storage class or code memory arrays may be discontinuous (e.g., segmented) or may cover a smaller area than depicted, to avoid vertical interconnects (e.g., within a logic area of memory apparatus 900; see FIG. 14, infra).

A substrate 910 of memory apparatus 900 can comprise MOS circuitry including a controller(s), CPU(s), radio(s), or sensor(s), as described herein. Additionally, a 1T1R array of code memory 930 and non-volatile resistive cells 940 (e.g., a resistive node retainer for volatile state change devices) can be provided in a first backend set of layers. Also formed in the first backend set of layers is a 1TnR non-volatile resistive SCM 920. In a second set of backend set of layers, at least in part overlying the first backend set of layers, is a second 1TnR non-volatile resistive SCM 925. In an embodiment, second 1TnR non-volatile resistive SCM 925 can be a 1TNR array, in which N and n have different values. In a further embodiment, the 1TNR array 925 can have different performance characteristics from the 1TnR array 920, such as different access time, write time, or the like.

Figure 10:
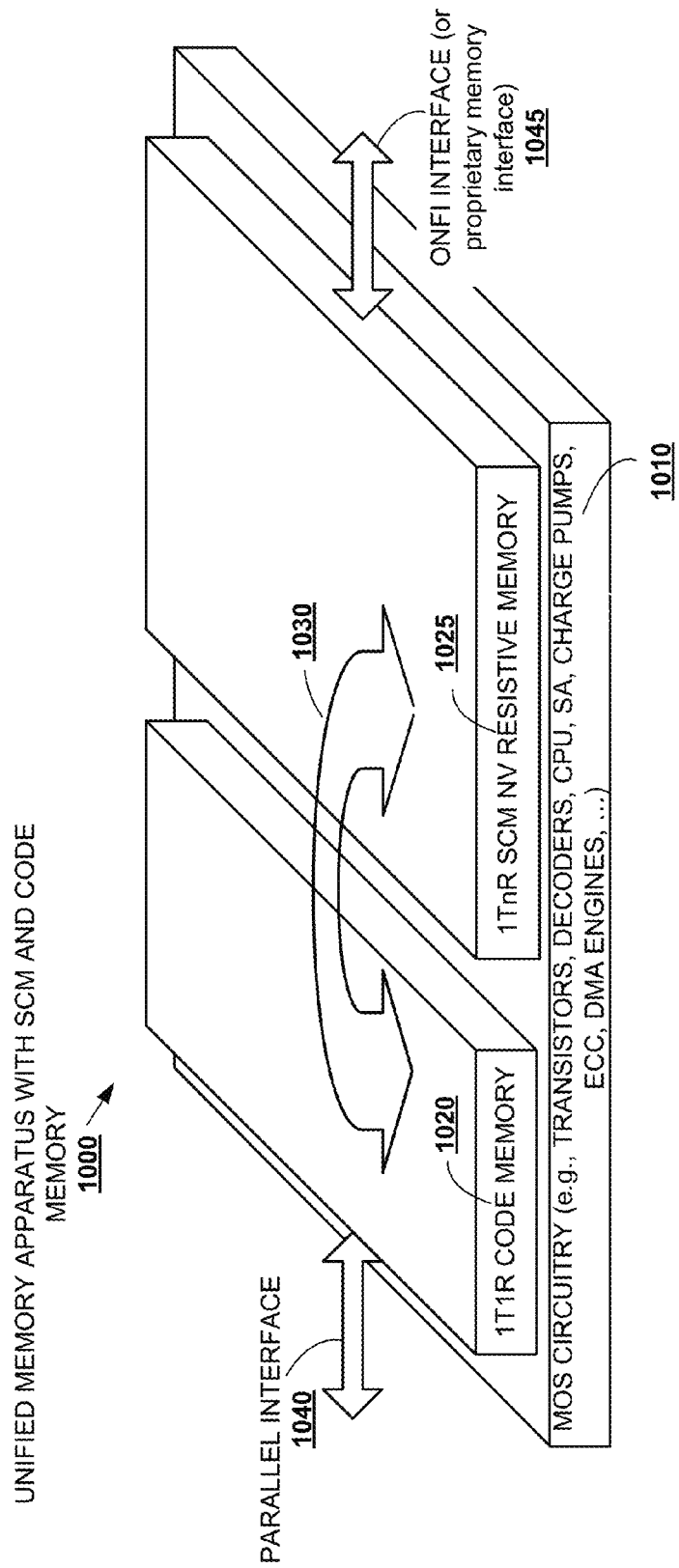
FIG. 10 depicts a block diagram of an example unified memory device comprising code memory and SCM in one or more additional embodiments.

FIG. 10 illustrates a block diagram of an example unified memory apparatus 1000 according to still other embodiments of the present disclosure. Unified memory apparatus 1000 can be a stand-alone memory device, in some embodiments, or can be a removable device in other embodiments. A substrate 1010 comprising MOS circuitry typically associated with memory devices including transistors, decoders, CPU(s), sense amps (SA), charge pumps, error correction code (ECC), DMA engine(s), and any other suitable processing, communication, control or correction components or logic. Additionally, unified memory apparatus 1000 can comprise 1T1R code memory 1020 connected to a parallel interface 1040. 1T1R code memory 1020 can communicate with a host device over parallel interface 1040, executing code and application instructions in response to a command from the host device. Similarly, memory apparatus 1000 can comprise storage class memory, a 1TnR non-volatile resistive SCM 1025 connected to a memory interface 1045. Memory interface 1045 can be a standard ONFI interface, in one embodiment, facilitating operability with standard ONFI memory controllers and devices (e.g., Flash controller/device, USB controller/device, etc.). In another embodiment, memory interface 1045 can be a proprietary interface, a non-standard interface, or a non-ONFI standard interface (e.g., a DRAM interface).

In a further embodiment, memory apparatus can comprise an internal interface 1030. Internal interface 1030 can facilitate data exchange between 1TnR non-volatile resistive SCM 1025 and 1T1R code memory 1020. Internal interface 1030 can be operable in conjunction with a DMA engine, for instance as described above at FIG. 7, infra.

Figure 11:
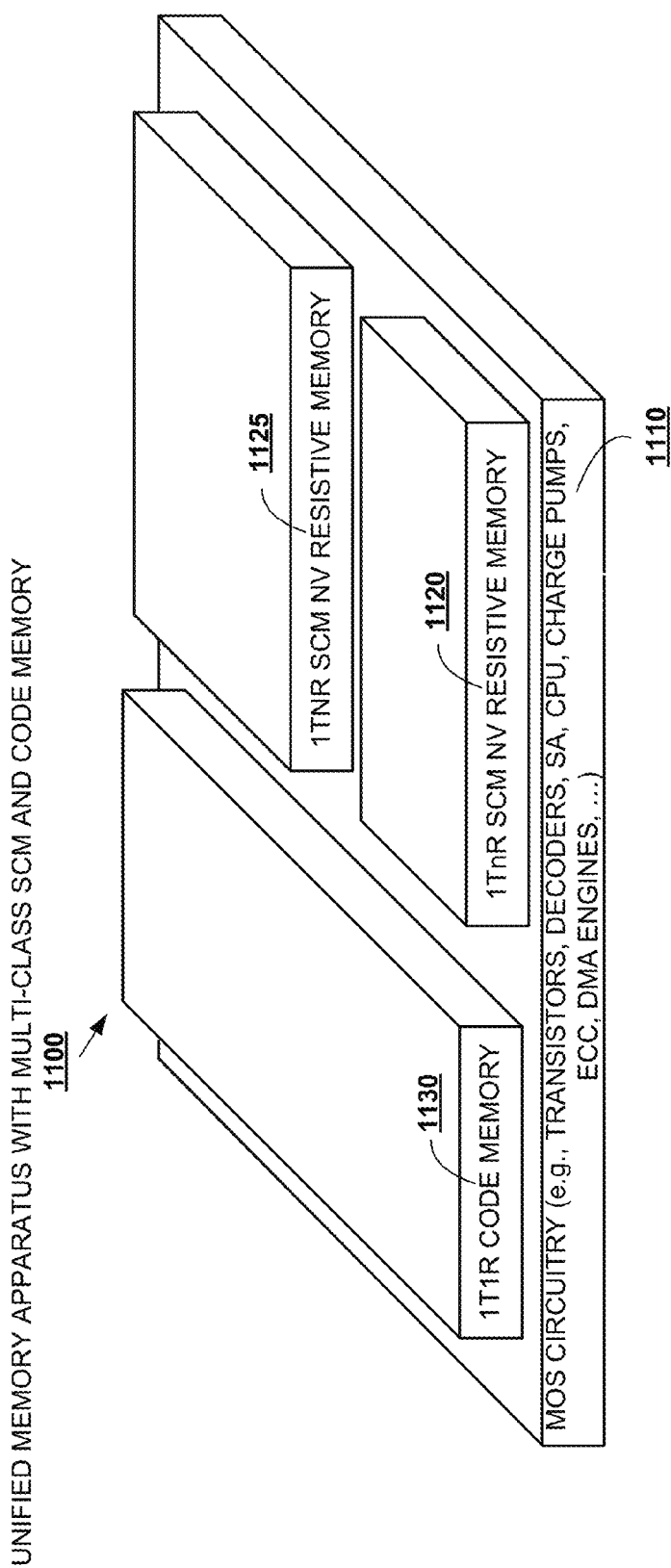
FIG. 11 illustrates a block diagram of a sample unified memory device comprising multiple types of SCM, in a further embodiment.

FIG. 11 illustrates a block diagram of a sample unified memory apparatus 1100 according to alternative or additional embodiments of the present disclosure. Unified memory apparatus 1100 can be substantially similar to unified memory apparatus 1000 of FIG. 10, supra, in some embodiments, except for the differences described below. In other embodiments, unified memory apparatus 1100 can have other differences not specifically described.

As illustrated, unified memory apparatus 1100 can comprise a substrate 1110 comprising MOS circuitry. The MOS circuitry can include suitable components to operate unified memory apparatus 1100 as a stand-alone memory device, or a removable electronic memory device. The MOS circuitry can comprise transistors, decoders, SA(s), CPU(s), charge pumps, ECC, DMA engine(s), and so on. Further, back end of line memory layers can comprise a 1T1R code memory 1130, formed in a first subset of the back end of line memory layers. Additionally, unified memory apparatus 1100 can comprise a 1TnR non-volatile resistive SCM 1120 in a second subset of the back end of line memory layers, and a 1TNR non-volatile resistive SCM 1125 in a third subset of the back end of line memory layers. In some embodiment, the DMA engine may be configured to transfer data between 1T1R code memory 130, 1TnR non-volatile resistive SCM 1120, and 1TNR non-volatile resistive SCM 1125.

Figure 12:
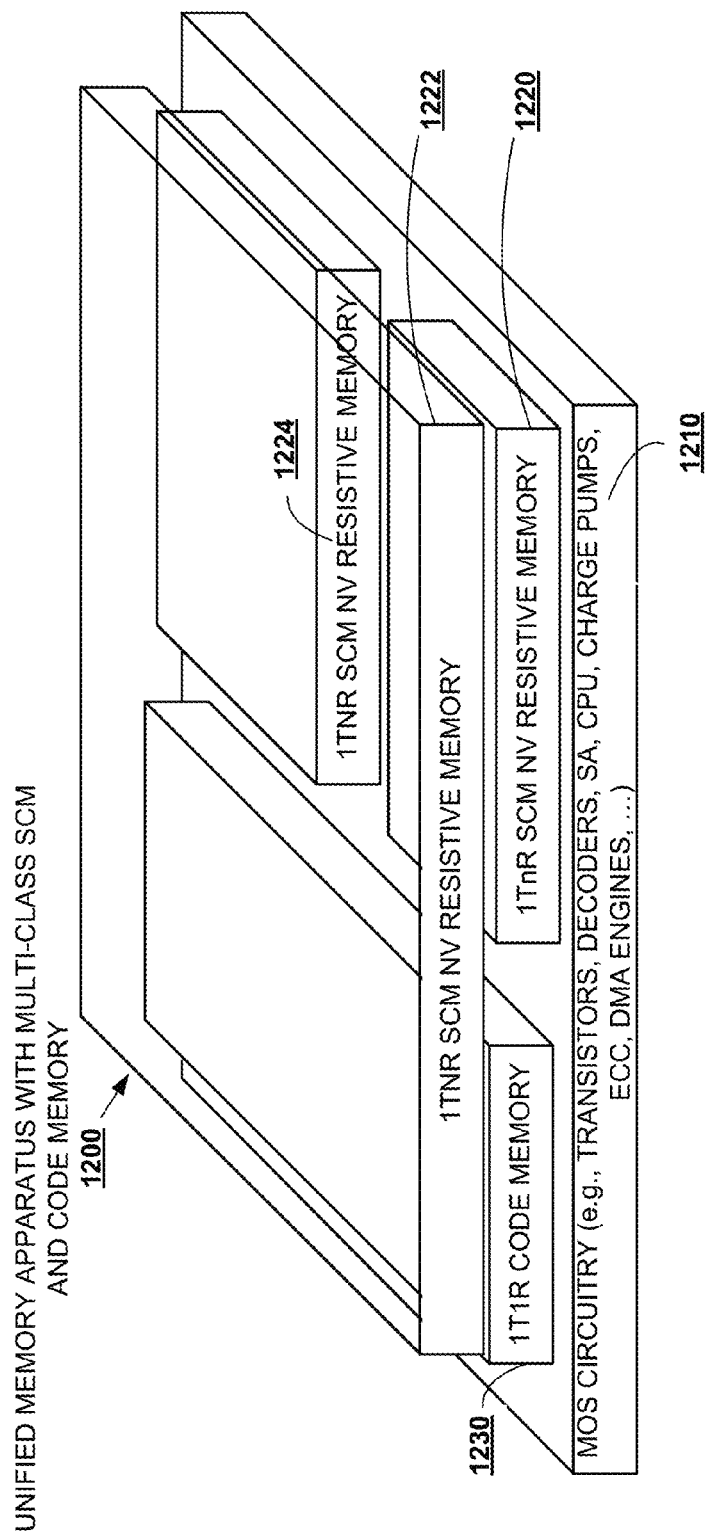
FIG. 12 depicts a block diagram of an example unified memory device comprising multiple types of SCM in multiple vertical sections over a substrate.

FIG. 12 depicts a block diagram of an example unified memory apparatus 1200 according to still other embodiments of the subject disclosure. Unified memory apparatus 1200 can comprise some or all of the features of unified memory apparatus 1000 of FIG. 10, in some embodiments, excepting the differences described below. In other embodiments, unified memory apparatus 1200 can comprise additional differences, not specifically described.

Unified memory apparatus 1200 comprises a substrate 1210 including MOS circuitry. MOS circuitry 1200 can be similar to that described above at FIG. 10, in some embodiments. For example, MOS circuitry 1200 can comprise transistors, decoders, SA(s), CPU(s), charge pumps, ECC, DMA engine(s), and so on, suitable to operate unified memory apparatus 1200 as a stand-alone memory device, or a removable memory device.

Unified memory apparatus 1200 can further comprise multiple arrays of resistive memory cells formed in backend layers of unified memory apparatus 1200. Further, unified memory apparatus 1200 can comprise multiple sets of backend memory layers stacked overlying substrate 1210. A first set of backend memory layers overlying substrate 1210 can comprise a 1T1R code memory 1230 in a first subset of the first set of backend memory layers, a 1TnR non-volatile resistive SCM 1220 in a second subset of the first set of backend memory layers, and a 1TNR non-volatile resistive SCM 1224 in a third subset of the first set of backend memory layers. Additionally, a second set of backend memory layers overlying the first set of backend memory layers and substrate 1210 is provided. The second set of backend memory layers can comprise an additional 1TNR non-volatile resistive SCM 1222 formed therein, in one embodiment. In another embodiment, the second set of backend memory layers can instead comprise an additional 1TnR non-volatile resistive SCM. In yet another embodiment, the second set of backend memory layers can comprise multiple non-volatile resistive SCM arrays. Although 1TNR non-volatile resistive SCM 1222 is illustrated as a continuous block, it should be appreciated that the block can comprise multiple arrays, some of which are continuous with other arrays, whereas others are non-continuous with one or more other arrays. For instance, non-continuous arrays can be separated by logic components, such as interconnects, metal lines, vias, or active devices such as data latches, or the like.

Figure 13:
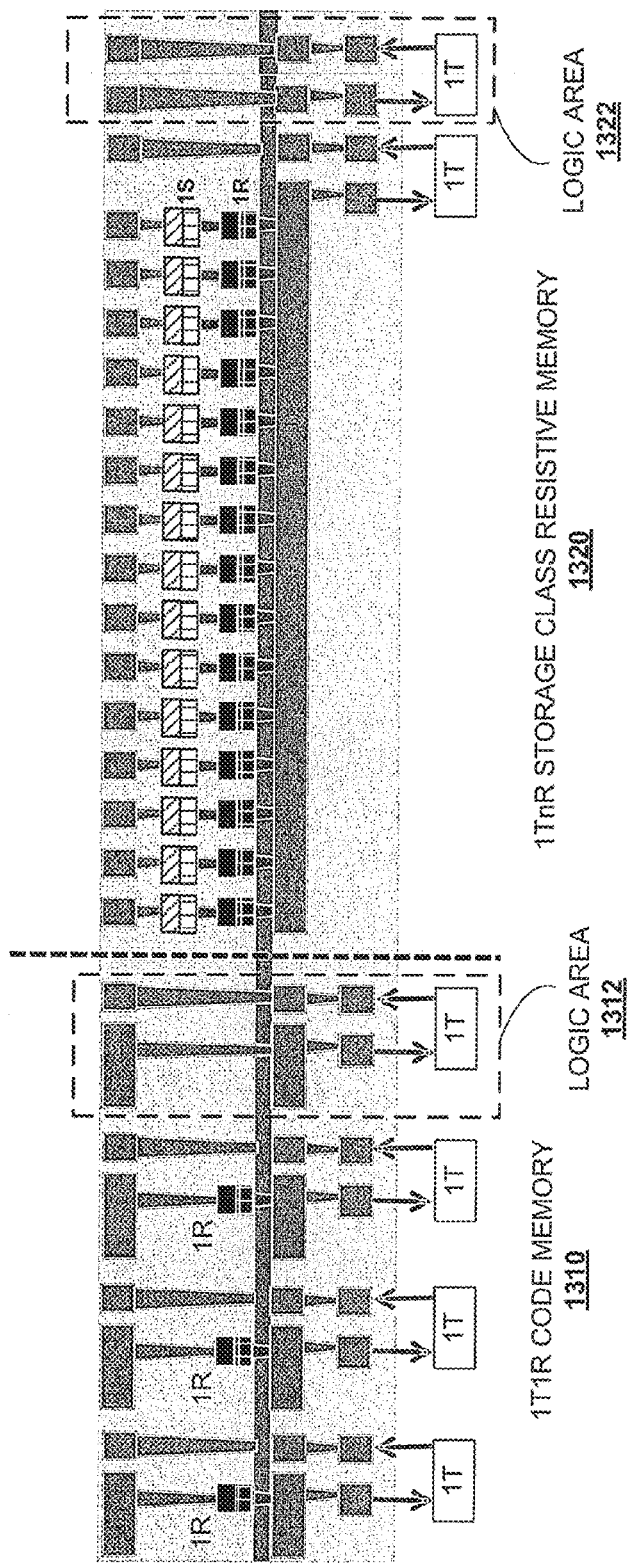
FIG. 13 illustrates a side view of a sample stack of material layers and respective logic areas for code memory and SCM, in an embodiment.

FIG. 13 illustrates a diagram of a memory cross section 1300 facilitating improved memory density. Memory cross section 1300 depicts a 1T1R code memory array 1310 on a left side of memory cross section 1300, and a 1TnR non-volatile resistive SCM 1320 on a right side of memory cross section 1300. Respective subsets of 1T1R code memory 1310 and 1TnR non-volatile resistive SCM 1320 include logic areas, specifically logic area 1312 and logic area 1322, set aside for logic components. Logic areas 1312, 1322 do not contain memory elements, and instead comprise interconnects, metal lines, vias, or the like, to facilitate operations of a memory device, or to interconnect components of 1T1R code memory 1310 and 1TnR non-volatile resistive SCM 1320 with MOS circuitry in a substrate (not depicted), such as 1T transistors. Other portions of the substrate can comprise additional MOS circuitry (e.g., in the open region below 1TnR non-volatile resistive SCM 1320.

Figure 14:
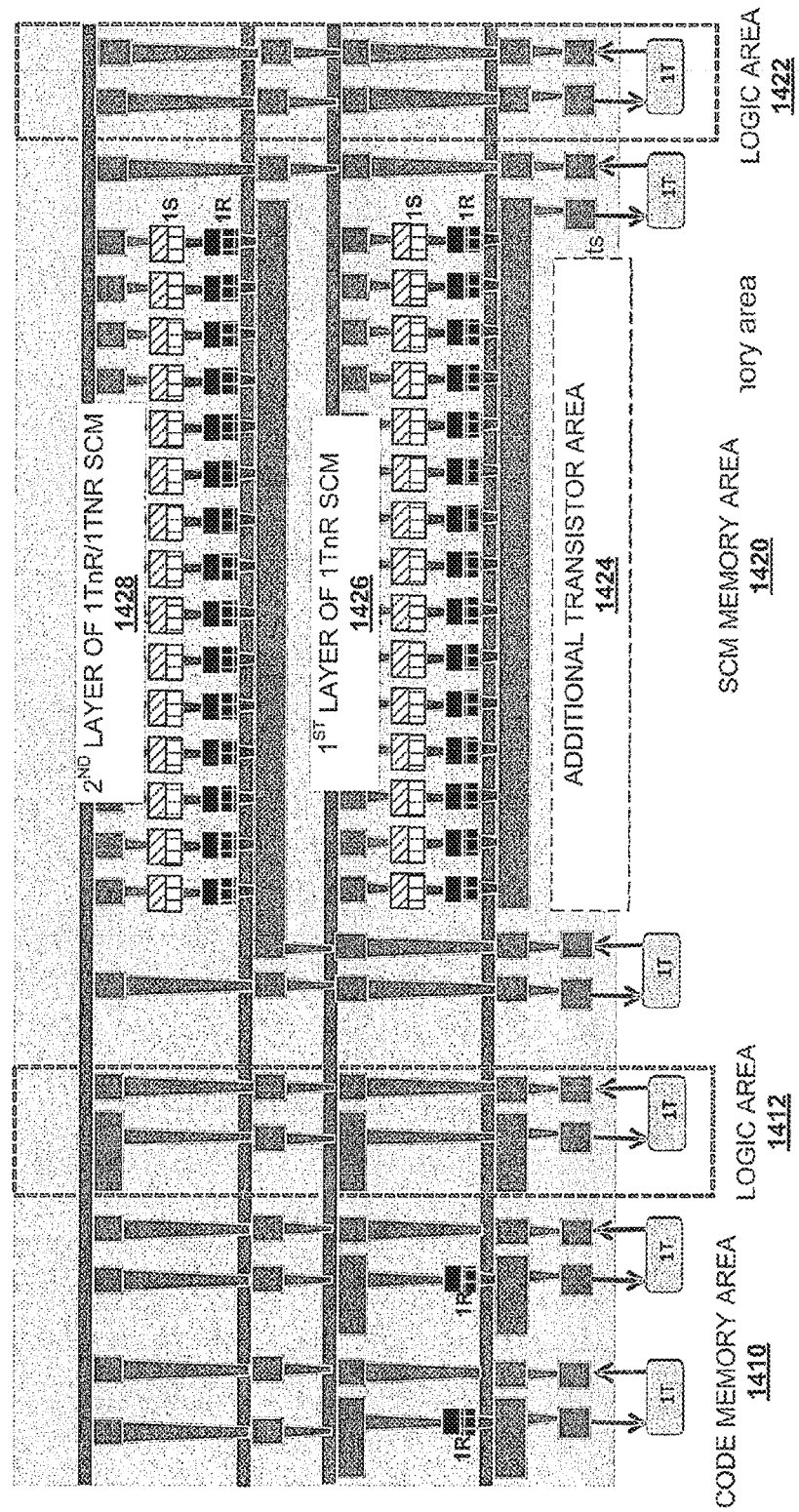
FIG. 14 illustrates a side view of an example stack of material layers for improved memory density, in another embodiment.

FIG. 14 depicts a diagram of an example memory cross section 1400 according to additional embodiments of the present disclosure. Memory cross section 1400 comprises a code memory area 1410 comprising a 1T1R array, and a SCM memory area 1420 comprising multiple, stacked 1TnR (or 1TNR) arrays, as depicted. For instance, in a first set of backend metal layers overlying a substrate, a $1^{st}$ layer of 1TnR (or 1TNR) SCM memory 1426 is provided. Overlying the first set of backend metal layers is a second set of backend metal layers comprising a $2^{nd}$ layer of 1TnR (or 1TNR) SCM memory 1428. Although two sets of backend metal layers are depicted, additional sets of backend metal layers overlying the first and second sets of backend metal layers can be provided, having additional SCM memory arrays in additional embodiments. Furthermore, memory cross section 1400 can comprise a first logic area 1412 adjacent to code memory area 1410, and a second logic area 1422 adjacent to SCM memory area 1420. Additional logic areas, though not depicted, can be provided within memory cross section in further embodiments. Furthermore, a region of the substrate below $1^{st}$ layer of 1TnR (or 1TNR) SCM memory 1426 can provide an additional area 1424 for MOS circuitry, including transistors, processors, state change devices, active devices, passive devices, and so forth.

Figure 15:
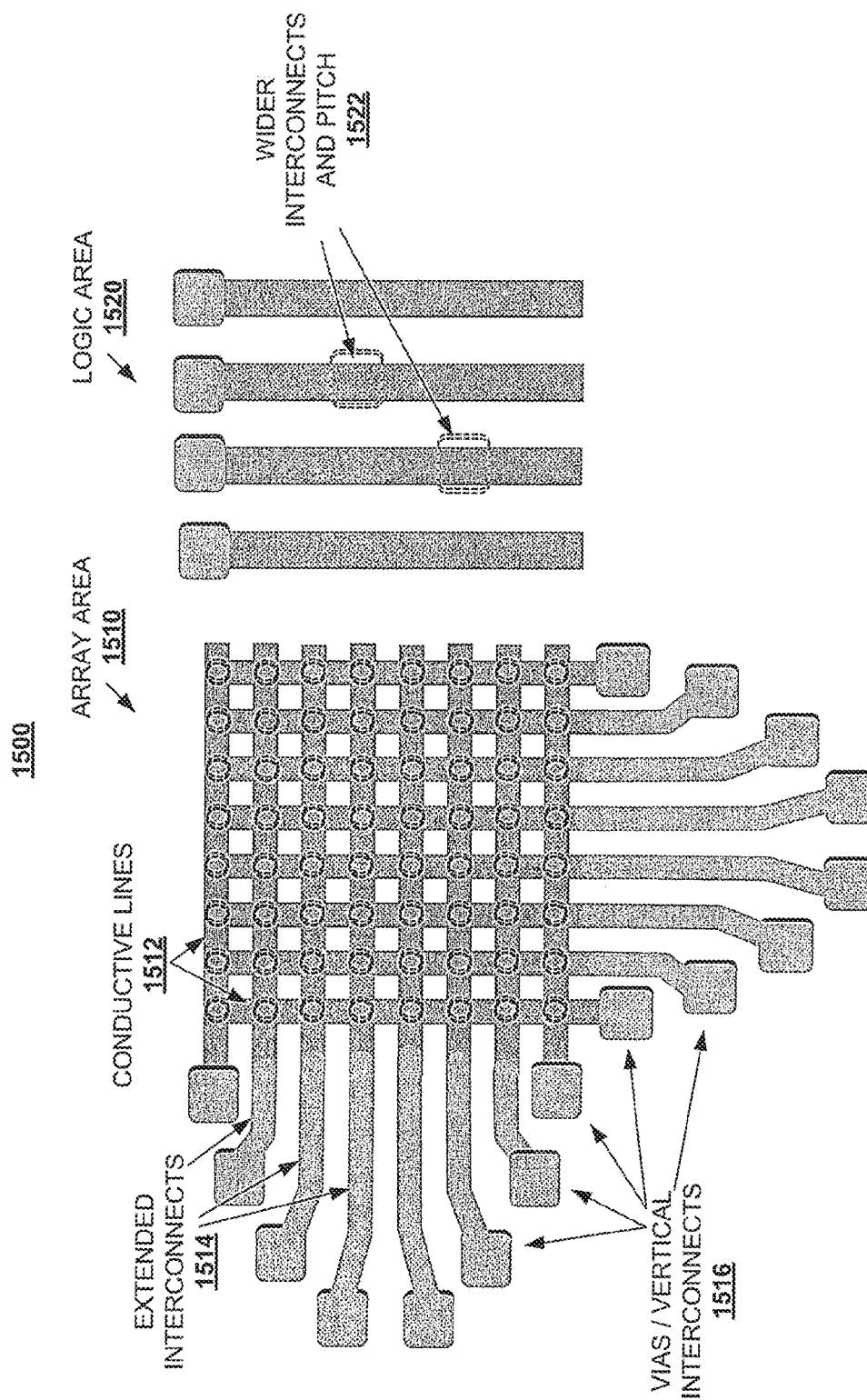
FIG. 15 depicts a diagram of an example interconnect structure for a disclosed memory device, in an additional embodiment.

FIG. 15 illustrates a diagram of an example wiring layout 1500 for a memory device, according to further embodiments. In an embodiment, wiring layout 1500 can employed for electrical connections between or among memory array architectures employed throughout this disclosure (e.g., see FIGS. 3, 4, 13 and 14, supra). Wiring layout 1500 can comprise an array wiring area 1510, and a logic wiring area 1520. Array wiring area 1510 can comprise a set of interconnecting conductive lines 1512, which can be metal lines, doped semiconductor lines, or the like, or a suitable combination of the foregoing. Extended interconnects 1514 are depicted that provide electrical continuity beyond the interconnecting conductive lines 1512. As illustrated, respective extended interconnects 1514 (or respective subsets thereof) can have different lengths, terminating in respective vias/vertical interconnects 1516. By providing different lengths, extended interconnects can facilitate greater spacing between vias/vertical interconnects 1516 than could be provided if vias/interconnects 1516 terminate conductive lines 1512 at immediate edges of the interconnecting region of conductive lines 1512.

Logic wiring area 1520 can comprise a plurality of conductive lines terminating in respective vias/vertical interconnects. In logic wiring area 1520, conductive lines can have a greater width (e.g., thickness) than conductive lines 1512 of array wiring area 1510. In addition, the conductive lines of logic wiring area 1520 can have a larger pitch (e.g., distance between conductive lines) than conductive lines 1512 of array wiring area 1510. The larger width and pitch of conductive lines in logic wiring area 1520 can facilitate parallel positioning of vias/interconnects, as illustrated at the top of logic wiring area 1520. In some embodiments, multiple logic areas 1520 can be employed for different portions of an integrated circuit. These multiple logic areas 1520 can be utilized for different components of the integrated circuit, as suitable. In the context of the present disclosure, for instance, a first logic area 1520 can be employed for a code memory structure and a second logic area 1520 can be employed for a storage class memory structure. Based on the embodiment, different characteristics, such as number of interconnects, pitch between interconnects, interconnect width, etc. can be employed for the first and second logic areas 1520, according to this example.

The aforementioned diagrams have been described with respect to different components of a memory apparatus, including types or classes of memory arrays, memory circuits, and MOS devices, and sets of monolithic layers for forming some or all of these components. It should be appreciated that in some suitable alternative aspects of the subject disclosure, such diagrams can include those components/arrays/circuits/devices/layers specified therein, some of the specified components/arrays/circuits/devices/layers, or additional components/arrays/circuits/devices/layers. Sub-components can also be implemented as electrically connected to other sub-components rather than included within a parent component/layer. For example, an array illustrated as a single block can optionally comprise multiple arrays electrically or operably interconnected, or multiple isolated arrays. As a further example, a stack of layers forming memory cells of an array can additionally comprise a suitable barrier layer that mitigates or controls unintended oxidation positioned between one or more disclosed layers, a suitable adhesion layer facilitating adhesion between two layers, a contact layer facilitating ohmic contact between two layers, or the like. In yet other embodiments, a disclosed set of layers can have fewer layers than depicted. For instance, a switching layer can electrically contact a conductive wire directly, rather than having an electrode layer there between. Additionally, it is noted that one or more disclosed processes can be combined into a single process providing aggregate functionality. Components of the disclosed architectures can also interact with one or more other components not specifically described herein but known by those of skill in the art.

Figure 16:
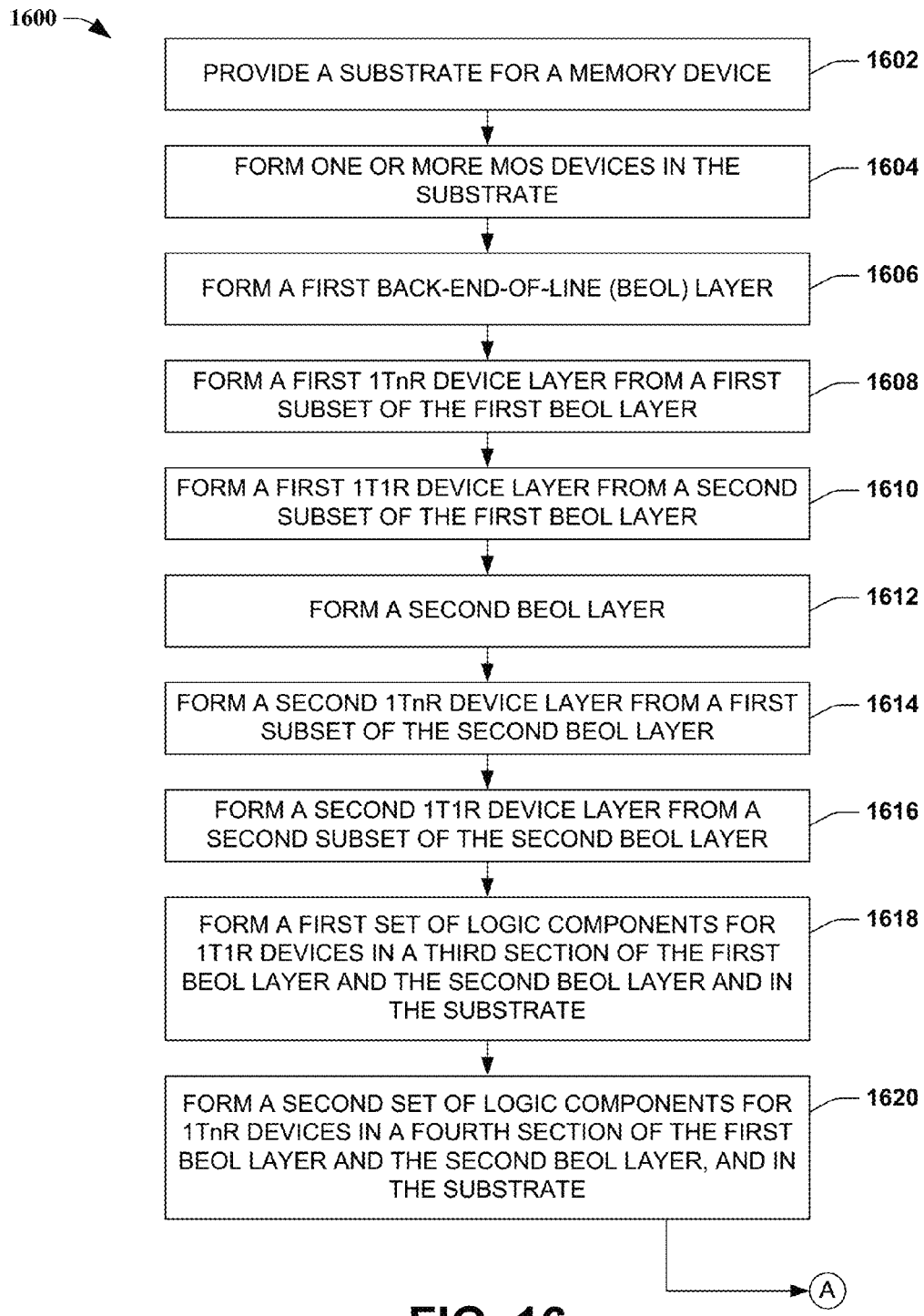
FIGS. 16, 16A and 16B depict a flowchart of a sample method for fabricating a monolithic memory device in one or more other embodiments.

In view of the exemplary diagrams described supra, a process method(s) that can be implemented in accordance with the disclosed subject matter will be better appreciated with reference to the flow chart of FIG. 16. While for purposes of simplicity of explanation, the method of FIG. 16 is shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the method(s) disclosed herein. Additionally, it should be further appreciated that some or all of the methods disclosed throughout this specification are capable of being stored on an article of manufacture to facilitate transporting and transferring such methods to an electronic device. The term article of manufacture, as used, is intended to encompass a computer program accessible from any computer-readable device, device in conjunction with a carrier, or storage medium.

FIG. 1600 depicts a flowchart of a sample method 1600 of fabricating a memory device, according to additional embodiments of the present disclosure. At 1602, method 1600 can comprise providing a substrate for a memory device. At 1604, method 1600 can comprise forming one or more MOS devices (e.g., CMOS devices, nMOS devices, pMOS devices, etc.) in the substrate. At 1606, method 1600 can comprise forming a first back-end-of-line (BEOL) layer. At 1608, method 1600 can comprise forming a first 1TnR device layer from a first subset of the first BEOL layer. At 1610, method 1600 can comprise forming a first 1T1R device layer from a second subset of the first BEOL layer. Additionally, at 1612, method 1600 can comprise forming a second BEOL layer. At 1614, method 1600 can comprise forming a second 1TnR device layer from a first subset of the second BEOL layer. Further, at 1616, method 1600 can comprise forming a second 1T1R device layer from a second subset of the second BEOL layer. At 1618, method 1600 can comprise forming a first set of logic components for 1T1R devices in a third section of the first BEOL layer and the second BEOL layer, and in the substrate. At 1620, method 1600 can comprise forming a second set of logic components for 1TnR devices in a fourth section of the first BEOL layer and the second BEOL layer, and in the substrate.

Figure 16A:
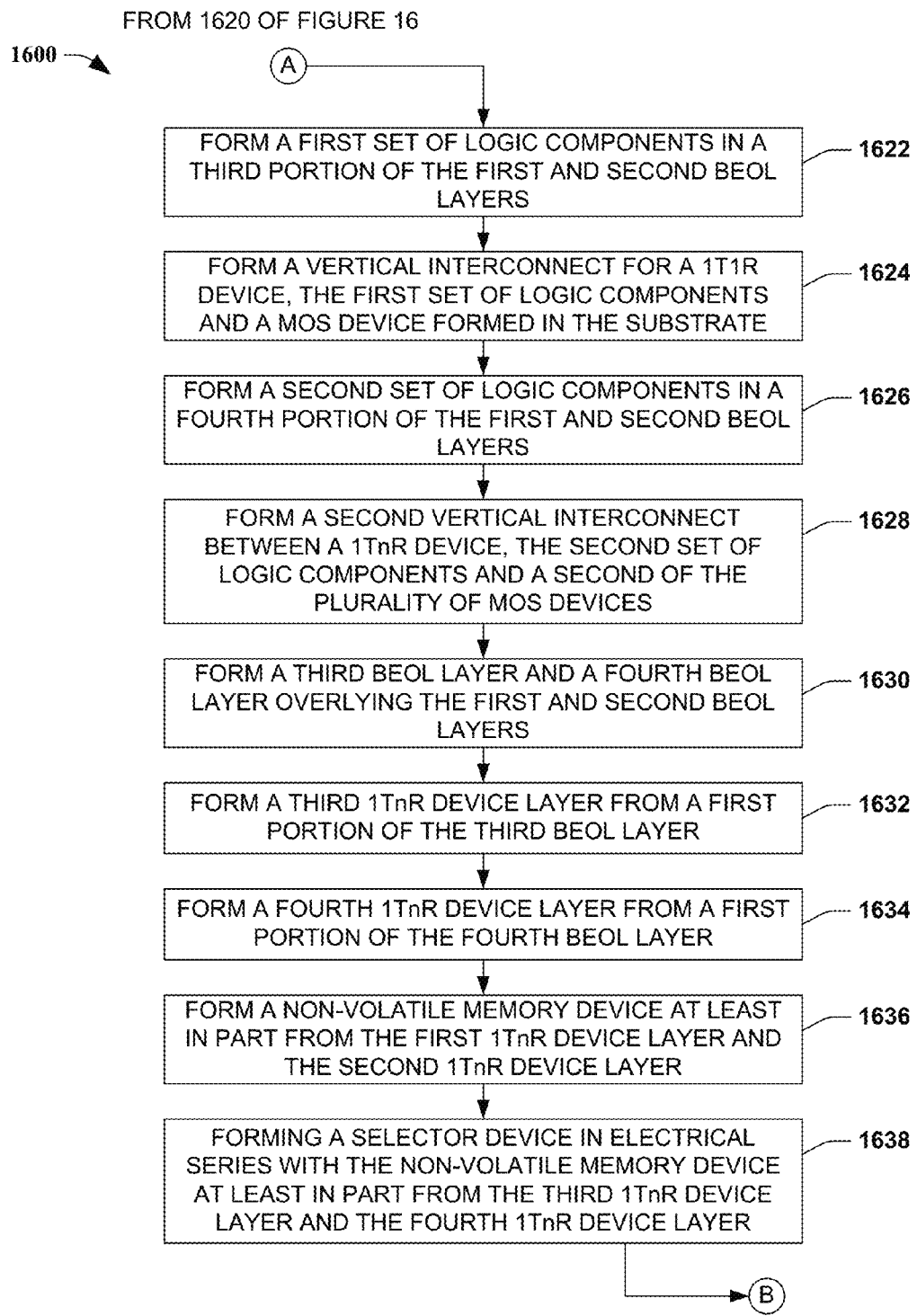

Referring now to FIG. 16A, method 1600 is continued. At 1622, method 1600 can comprise forming a first set of logic components in a third portion of the first BEOL layer and the second BEOL layer. At 1624, method 1600 can comprise forming a vertical interconnect for a 1T1R device, the first set of logic components and a MOS device formed in the substrate of the memory device. In an embodiment, the 1T1R device can be formed at least in part from the first 1T1R device layer and the second 1T1R device layer. Further, at 1626, method 1600 can comprise forming a second set of logic components in a fourth portion of the first BEOL layer and the second BEOL layer, and at 1628, method 1600 can comprise forming a second vertical interconnect between a 1TnR device, the second set of logic components and a second fo the plurality of MOS devices formed in the substrate of the memory device. In various embodiments, the 1TnR device can be formed at least in part from the first 1TnR device layer and the second 1TnR device layer.

At 1630, method 1600 can comprise forming a third BEOL layer and a fourth BEOL layer overlying the first BEOL layer and the second BEOL layer. At 1632, method 1600 can comprise forming a third 1TnR device layer from a first portion of the third BEOL layer, and at 1634, method 1600 can comprise forming a fourth 1TnR device layer from a first portion of the fourth BEOL layer. Additionally, at 1636, method 1600 can comprise forming a non-volatile memory device at least in part from the first 1TnR device layer and the second 1TnR device layer, and at 1638, forming a selector device in electrical series with the non-volatile memory device at least in part from the third 1TnR device layer and the fourth 1TnR device layer.

Figure 16B:
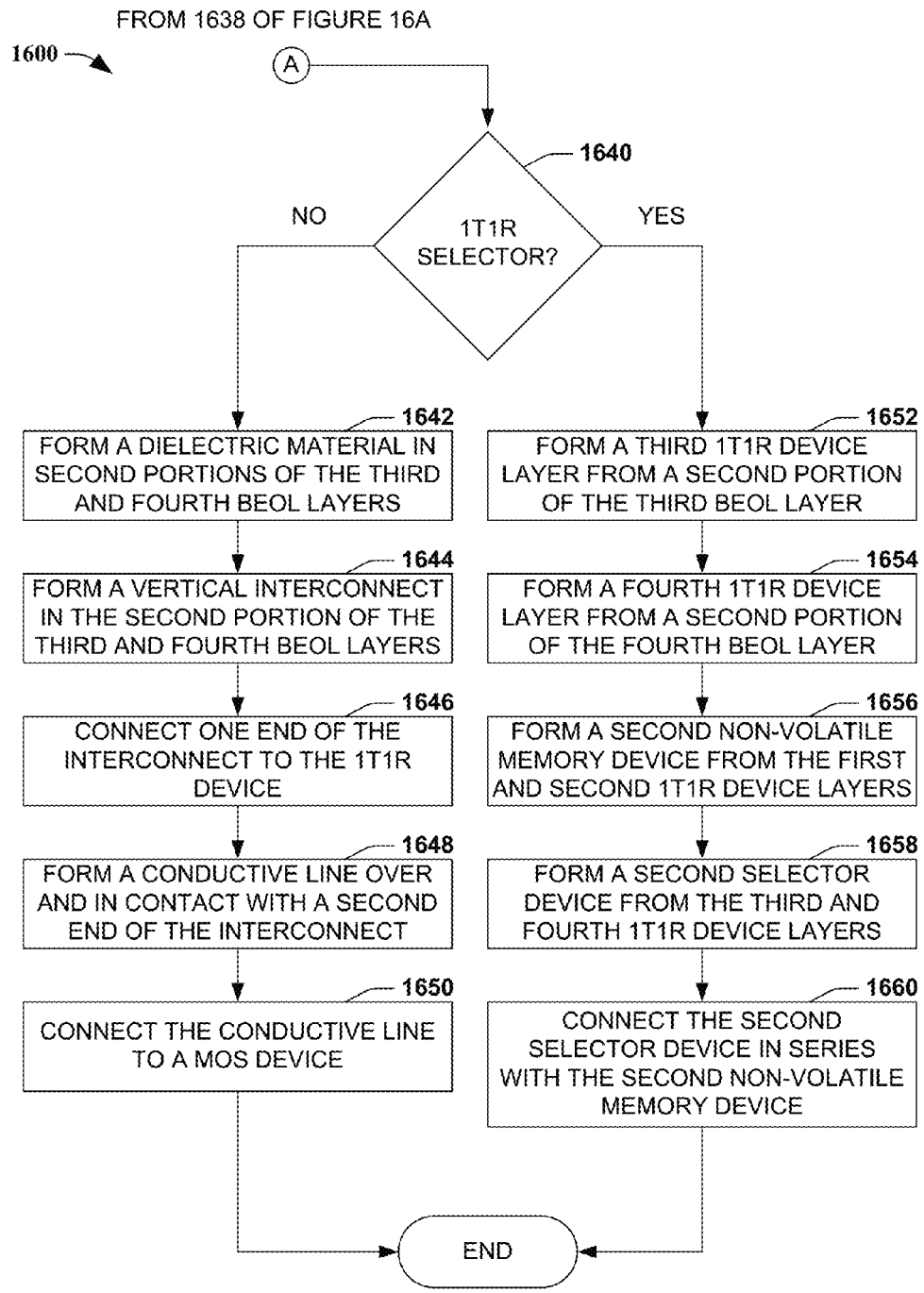

Turning to FIG. 16B, method 1600 can continue. At 1640, method 1600 can proceed according to alternative embodiments depending on whether a 1T1R selector device is to be fabricated. If the 1T1R selector device is to be fabricated, method 1600 can proceed at 1652; otherwise, method 1600 can proceed at 1642. Note that decision 1640 may or may not be an active step in a fabrication process consistent with the present disclosure. For instance, where a control process is automated the decision step may be incorporated into control logic for automatic processes, in which case the decision step can be part of the disclosed method (as implemented in an automated process control device, such as a computer—see FIG. 18, infra). In other embodiments, method 1600 can be implemented as alternative embodiments incorporating steps 1642-1650, or steps 1652-1660. As previously stated, however, the subject disclosure is not limited by the provided steps or blocks describing these steps, as methods including a subset of the disclosed steps, all of the steps, or different steps not expressly disclosed but known to one of ordinary skill in the art or evident to one of ordinary skill by way of the context provided herein, are considered within the scope of the subject disclosure.

At 1642, method 1600 can comprise forming a dielectric material in a second portion of the third BEOL layer and a second portion of the fourth BEOL layer. The second portions of the third BEOL and fourth BEOL layers can overly the second portion of the first and second BEOL layers, in an embodiment. Further, at 1644, method 1600 can comprise forming a vertical interconnect in the second portion of the third and fourth BEOL layers, and at 1646, connecting one end of the vertical interconnect in electrical contact with a top electrode of the 1T1R device. At 1648, method 1600 can comprise forming a conductive line overlying and in electrical contact with a second end of the vertical interconnect. At 1650, method 1600 can comprise connecting the conductive line to one of the plurality of MSO devices formed in the substrate. From 1650, method 1600 can end.

At 1652, method 1600 can comprise forming a third 1T1R device layer from a second portion of the third BEOL layer, and at 1654, forming a fourth 1T1R device layer from a second portion of the fourth BEOL layer. Further, at 1656, method 1600 can comprise forming a second non-volatile memory device at least in part from the first 1T1R device layer and the second 1T1R device layer. At 1658, method 1600 can additionally comprise forming a second selector device at least in part from the third 1T1R device layer and from the fourth 1T1R device layer. At 1660, method 1600 can comprise forming the second selector device in electrical series with the second non-volatile memory device, and from 1660, method 1600 can end.

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing.

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. Such considerations are addressed by the disclosed aspects.

Figure 17:
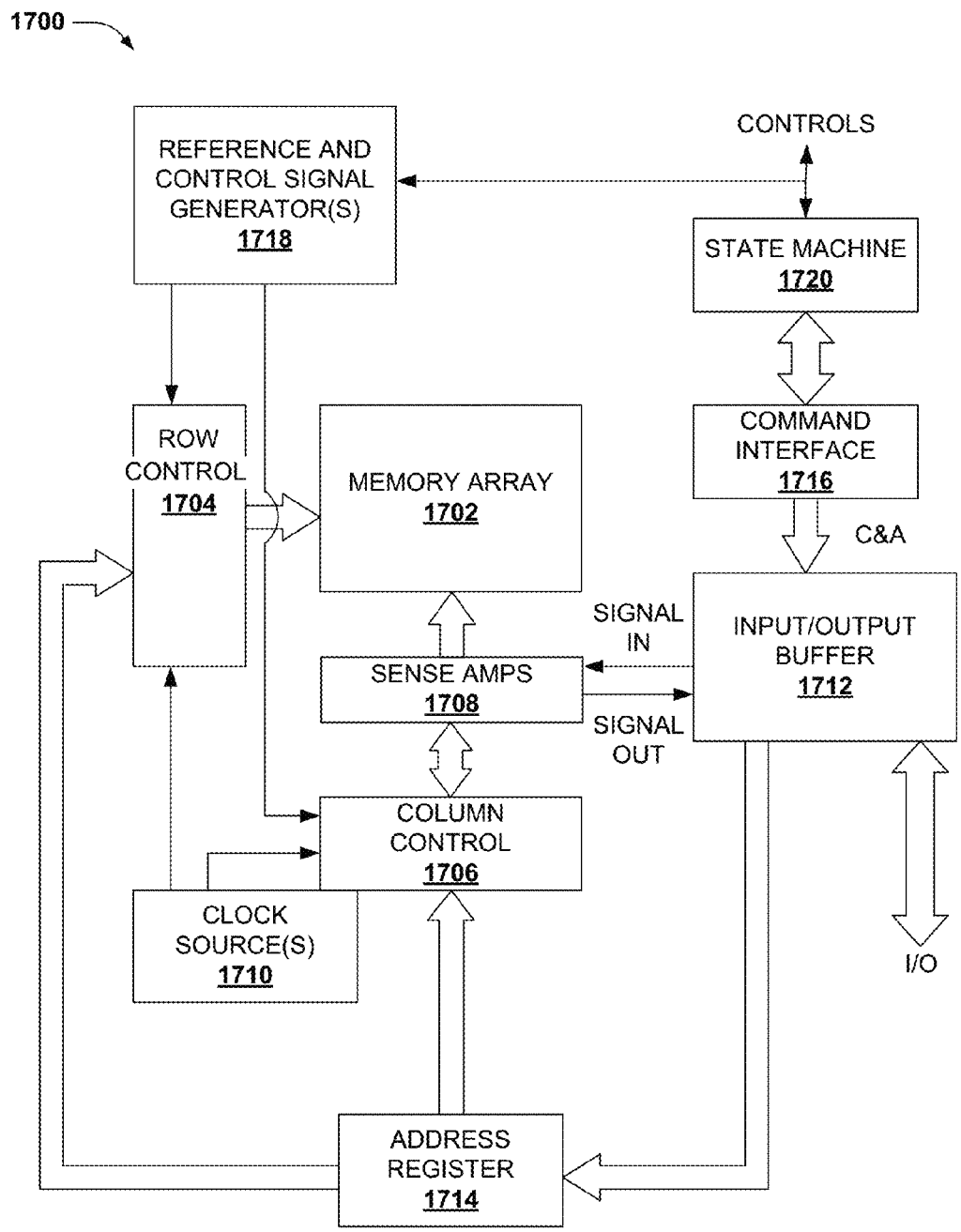
FIG. 17 depicts a block diagram of a sample operating environment for facilitating implementation of one or more disclosed embodiments.

FIG. 17 illustrates a block diagram of an example operating and control environment 1700 for a memory array 1702 of a memory cell array according to aspects of the subject disclosure. In at least one aspect of the subject disclosure, memory array 1702 can comprise memory selected from a variety of memory cell technologies. In at least one embodiment, memory array 1702 can comprise a two-terminal memory technology, arranged in a compact two or three dimensional architecture. Example architectures can include a 1T1R memory array, and a 1TnR memory array (or 1TNR memory array), as disclosed herein. Suitable two-terminal memory technologies can include resistive-switching memory, conductive-bridging memory, phase-change memory, organic memory, magneto-resistive memory, or the like, or a suitable combination of the foregoing.

A column controller 1706 and sense amps 1708 can be formed adjacent to memory array 1702. Moreover, column controller 1706 can be configured to activate (or identify for activation) a subset of bit lines of memory array 1702. Column controller 1706 can utilize a control signal provided by a reference and control signal generator(s) 1718 to activate, as well as operate upon, respective ones of the subset of bitlines, applying suitable program, erase or read voltages to those bitlines. Non-activated bitlines can be kept at an inhibit voltage (also applied by reference and control signal generator(s) 1718), to mitigate or avoid bit-disturb effects on these non-activated bitlines.

In addition, operating and control environment 1700 can comprise a row controller 1704. Row controller 1704 can be formed adjacent to and electrically connected with word lines of memory array 1702. Also utilizing control signals of reference and control signal generator(s) 1718, row controller 1704 can select particular rows of memory cells with a suitable selection voltage. Moreover, row controller 1704 can facilitate program, erase or read operations by applying suitable voltages at selected word lines.

Sense amps 1708 can read data from, or write data to the activated memory cells of memory array 1702, which are selected by column control 1706 and row control 1704. Data read out from memory array 1702 can be provided to an input/output buffer 1712. Likewise, data to be written to memory array 1702 can be received from the input/output buffer 1712 and written to the activated memory cells of memory array 1702.

A clock source(s) 1708 can provide respective clock pulses to facilitate timing for read, write, and program operations of row controller 1704 and column controller 1706. Clock source(s) 1708 can further facilitate selection of word lines or bit lines in response to external or internal commands received by operating and control environment 1700. Input/output buffer 1712 can comprise a command and address input, as well as a bidirectional data input and output. Instructions are provided over the command and address input, and the data to be written to memory array 1702 as well as data read from memory array 1702 is conveyed on the bidirectional data input and output, facilitating connection to an external host apparatus, such as a computer or other processing device (not depicted, but see e.g., computer 1102 of FIG. 11, infra).

Input/output buffer 1712 can be configured to receive write data, receive an erase instruction, receive a status or maintenance instruction, output readout data, output status information, and receive address data and command data, as well as address data for respective instructions. Address data can be transferred to row controller 1704 and column controller 1706 by an address register 1710. In addition, input data is transmitted to memory array 1702 via signal input lines between sense amps 1708 and input/output buffer 1712, and output data is received from memory array 1702 via signal output lines from sense amps 1708 to input/output buffer 1712. Input data can be received from the host apparatus, and output data can be delivered to the host apparatus via the I/O bus.

Commands received from the host apparatus can be provided to a command interface 1716. Command interface 1716 can be configured to receive external control signals from the host apparatus, and determine whether data input to the input/output buffer 1712 is write data, a command, or an address. Input commands can be transferred to a state machine 1720.

State machine 1720 can be configured to manage programming and reprogramming of memory array 1702 (as well as other memory banks of a multi-bank memory array). Instructions provided to state machine 1720 are implemented according to control logic configurations, enabling state machine to manage read, write, erase, data input, data output, and other functionality associated with memory cell array 1702. In some aspects, state machine 1720 can send and receive acknowledgments and negative acknowledgments regarding successful receipt or execution of various commands. In further embodiments, state machine 1720 can decode and implement status-related commands, decode and implement configuration commands, and so on.

To implement read, write, erase, input, output, etc., functionality, state machine 1720 can control clock source(s) 1708 or reference and control signal generator(s) 1718. Control of clock source(s) 1708 can cause output pulses configured to facilitate row controller 1704 and column controller 1706 implementing the particular functionality. Output pulses can be transferred to selected bit lines by column controller 1706, for instance, or word lines by row controller 1704, for instance.

In connection with FIG. 18, some or all of the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 18:
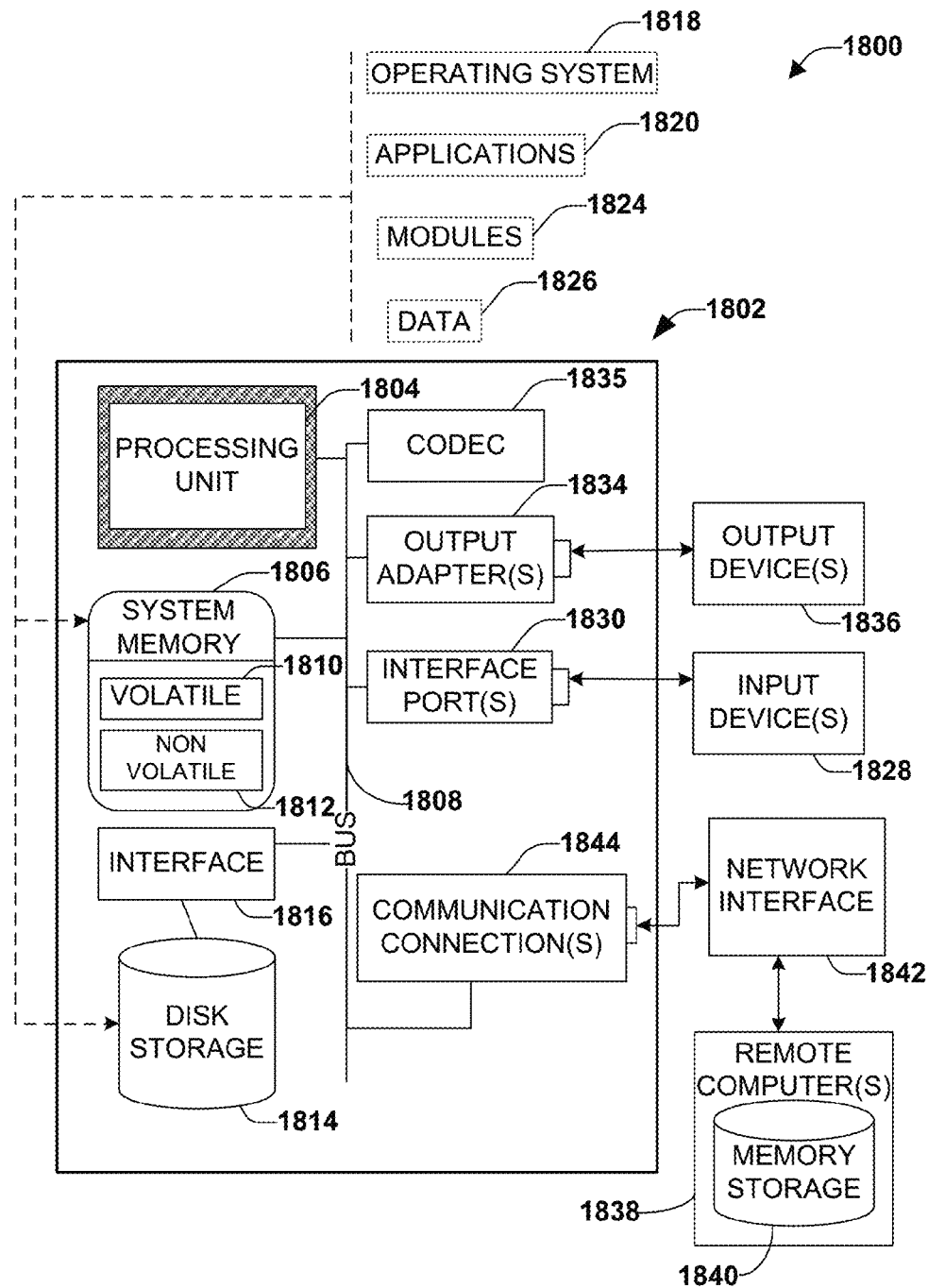
FIG. 18 illustrates a block diagram of an example computing environment that can be implemented in conjunction with various embodiments.

With reference to FIG. 18, a suitable operating environment 1800 for implementing various aspects of the claimed subject matter includes a computer 1802. The computer 1802 includes a processing unit 1804, a system memory 1806, a codec 1835, and a system bus 1808. The system bus 1808 communicatively inter-connects system components including, but not limited to, the system memory 1806 to the processing unit 1804. The processing unit 1804 can be any of various available processors. Dual microprocessors and other multiprocessor architectures also can be employed as the processing unit 1804.

The system bus 1808 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1806 includes volatile memory 1810 and non-volatile memory 1814, which can employ one or more of the disclosed memory architectures, in various embodiments. The basic input/output system (BIOS), containing the basic routines to transfer information between elements within the computer 1802, such as during start-up, is stored in non-volatile memory 1812. In addition, according to present innovations, codec 1835 may include at least one of an encoder or decoder, wherein the at least one of an encoder or decoder may consist of hardware, software, or a combination of hardware and software. Although, codec 1835 is depicted as a separate component, codec 1835 may be contained within non-volatile memory 1812. By way of illustration, and not limitation, non-volatile memory 1812 can include read only memory (ROM), programmable ROM (PROM), electrically programmable ROM (EPROM), electrically erasable programmable ROM (EEPROM), Flash memory, or two-terminal memory (e.g., resistive-switching memory). Non-volatile memory 1812 can employ one or more of the disclosed memory architectures, in at least some disclosed embodiments. Moreover, non-volatile memory 1812 can be computer memory (e.g., physically integrated with computer 1802 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1810 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1802 may also include removable/non-removable, volatile/non-volatile computer storage medium. FIG. 18 illustrates, for example, disk storage 1814. Disk storage 1814 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1814 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1814 to the system bus 1808, a removable or non-removable interface is typically used, such as interface 1816. It is appreciated that disk storage 1814 can store information related to a user. Such information might be stored at or provided to a server or to an application running on a user device. In one embodiment, the user can be notified (e.g., by way of output device(s) 1836) of the types of information that are stored to disk storage 1814 and/or transmitted to the server or application. The user can be provided the opportunity to opt-in or opt-out of having such information collected and/or shared with the server or application (e.g., by way of input from input device(s) 1828).

It is to be appreciated that FIG. 18 describes software that acts as an intermediary between users and the basic computer resources described in the suitable operating environment 1800. Such software includes an operating system 1818. Operating system 1818, which can be stored on disk storage 1814, acts to control and allocate resources of the computer 1802. Applications 1820 take advantage of the management of resources by operating system 1818 through program modules 1824, and program data 1826, such as the boot/shutdown transaction table and the like, stored either in system memory 1806 or on disk storage 1814. It is to be appreciated that the claimed subject matter can be implemented with various operating systems or combinations of operating systems.

A user enters commands or information into the computer 1802 through input device(s) 1828. Input devices 1828 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1804 through the system bus 1808 via interface port(s) 1830. Interface port(s) 1830 include, for example, a serial port, a parallel port, a game port, and a universal serial bus (USB). Output device(s) 1836 use some of the same type of ports as input device(s) 1828. Thus, for example, a USB port may be used to provide input to computer 1802 and to output information from computer 1802 to an output device 1836. Output adapter 1834 is provided to illustrate that there are some output devices, such as monitors, speakers, and printers, among other output devices, which require special adapters. The output adapter 1834 can include, by way of illustration and not limitation, video and sound cards that provide a means of connection between the output device 1836 and the system bus 1808. It should be noted that other devices and/or systems of devices provide both input and output capabilities such as remote computer(s) 1838.

Computer 1802 can operate in a networked environment using logical connections to one or more remote computers, such as remote computer(s) 1838. The remote computer(s) 1838 can be a personal computer, a server, a router, a network PC, a workstation, a microprocessor based appliance, a peer device, a smart phone, a tablet, or other network node, and typically includes many of the elements described relative to computer 1802. For purposes of brevity, only a memory storage device 1840 is illustrated with remote computer(s) 1838. Remote computer(s) 1838 is logically connected to computer 1802 through a network interface 1842 and then connected via communication connection(s) 1844. Network interface 1842 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1844 refers to the hardware/software employed to connect the network interface 1842 to the system bus 1808. While communication connection 1844 is shown for illustrative clarity inside computer 1802, it can also be external to computer 1802. The hardware/software necessary for connection to the network interface 1842 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. An integrated circuit, comprising:
   a substrate comprising a plurality of metal oxide semiconductor (MOS) devices formed at least in part within the substrate;
   a set of layers overlying the substrate and the MOS devices and facilitating electrical interconnection of two or more of the plurality of MOS devices, the set of layers comprising at least two layers;
   a first array of two-terminal memory devices formed among a first subset of the set of layers, wherein the first array of two-terminal memory devices is formed in a one-transistor, multiple-resistor (1TnR, where n is an integer greater than 1) array architecture; and
   a second array of two-terminal memory devices formed among a second subset of the set of layers, wherein the second array of two-terminal memory devices is formed in a one-transistor, one-resistor (1T1R) array architecture, and wherein the first array of two-terminal memory devices and the second array of two-terminal memory devices share a common layer.

2. The integrated circuit of claim 1, wherein the common layer provides a resistive switching material that facilitates non-volatile switching operation for memory cells of the 1T1R array architecture and for memory cells of the 1TnR array architecture.

3. The integrated circuit of claim 1, wherein the common layer provides a bottom electrode material for memory cells of the 1T1R array architecture and for memory cells of the 1TnR array architecture.

4. The integrated circuit of claim 1, wherein the common layer provides a top electrode material for memory cells of the 1T1R array architecture and for memory cells of the 1TnR array architecture.

5. The integrated circuit of claim 1, wherein the first array of two-terminal memory devices and the second array of two-terminal memory devices share multiple common layers that includes the common layer.

6. The integrated circuit of claim 5, wherein the multiple common layers provide a common resistive switching material layer and a common active metal layer for the 1T1R array architecture and for the 1TnR array architecture.

7. The integrated circuit of claim 1, wherein memory cells of the 1TnR array architecture comprise respective volatile selector devices formed in series with non-volatile resistive switching devices.

8. The integrated circuit of claim 7, wherein memory cells of the 1T1R array architecture comprise a second set of respective volatile selector devices formed in series with a second set of non-volatile resistive switching devices.

9. The integrated circuit of claim 1, further comprising a first logic area comprising a first set of vertical interconnects that electrically couple the 1T1R array architecture to a subset of the plurality of MOS devices.

10. The integrated circuit of claim 9, wherein the first logic area is exclusive to the 1T1R array architecture.

11. The integrated circuit of claim 9, wherein a pitch that defines a distance between respective vertical interconnects of the first set of vertical interconnects within the first logic area is greater than a second pitch that defines a second distance between metal lines of the first subset of the set of layers where the first array of two-terminal memory devices is formed.

12. The integrated circuit of claim 9, wherein a pitch that defines a distance between respective vertical interconnects of the first set of vertical interconnects within the first logic area is greater than a second pitch that defines a second distance between metal lines of the second subset of the set of layers where the second array of two-terminal memory devices is formed.

13. The integrated circuit of claim 9, wherein a thickness of the first set of vertical interconnects is larger than a second thickness of the metal lines of the first subset of the set of layers where the first array of two-terminal memory devices is formed, or a third thickness of the metal lines of the second subset of the set of layers where the second array of two-terminal memory devices is formed.

14. The integrated circuit of claim 9, further comprising a second logic area comprising a second set of vertical interconnects that electrically couple the 1TnR array architecture to a second subset of the plurality of MOS devices.

15. The integrated circuit of claim 14, wherein the second logic area is exclusive to the 1TnR array architecture.

16. The integrated circuit of claim 1, further comprising:
a second set of layers overlying the substrate and the MOS devices and overlapping the set of layers; and
a second 1TnR array architecture formed within the second set of layers and at least in part overlying the 1TnR array architecture.

17. The integrated circuit of claim 16, wherein the second 1TnR array architecture extends at least in part over the 1T1R array architecture.

18. The integrated circuit of claim 1, wherein at least one of the MOS devices is formed in a region of the substrate underlying the 1TnR array architecture, and is not operably connected to the first array of two-terminal memory devices.

19. The integrated circuit of claim 18, wherein the at least one of the MOS devices is not operably connected to the second array of two-terminal memory devices.

20. The integrated circuit of claim 1, further comprising:
a direct memory access engine
a command interface facilitating command operation between the 1T1R array architecture and the direct memory access engine; and
one or more data interfaces facilitating data transfer between the 1TnR array architecture, the direct memory access engine and the 1T1R array architecture, wherein:
the direct memory access engine is configured to store data from the 1T1R array architecture at the 1TnR array architecture or to retrieve data from the 1TnR array architecture and provide the retrieved data to the 1T1R array architecture in response to one or more commands received over the command interface.

21. A memory apparatus, comprising:
a substrate having a plurality of metal oxide semiconductor (MOS) devices formed therein;
a first set of backend memory layers, comprising at least a first subset of the backend memory layers and a second subset of the backend memory layers;
a one-transistor, one-resistor (1T1R) resistive memory cell array formed within the first subset of the backend memory layers at least in part from the first set of backend memory layers;
a one-transistor, multiple-resistor (1TnR, where n is an integer greater than 1) resistive memory cell array formed within the second subset of the backend memory layers at least in part from the first set of backend memory layers;
a first set of interconnects coupling the 1T1R resistive memory cell array to a first of the plurality of MOS devices formed in the substrate; and
a second set of interconnects connecting the 1TnR resistive memory cell array to a second of the plurality of MOS devices formed in the substrate, wherein the 1T1R resistive memory cell array and the 1TnR resistive memory cell array are fabricated in part from at least one common layer of the first set of backend memory layers.

22. The memory apparatus of claim 21, wherein the 1T1R resistive memory cell array and the 1TnR resistive memory array are fabricated in part from a second common layer of the first set of backend memory layers.

23. The memory apparatus of claim 22, wherein the one common layer of the first set of backend memory layers forms a first set of electrodes utilized for the 1T1R resistive memory cell array, and forms a second set of electrodes utilized for the 1TnR resistive memory cell array.

24. The memory apparatus of claim 22, wherein the second common layer of the first set of backend memory layers forms a first set of resistive switching layers for the 1T1R resistive memory cell array, and forms a second set of resistive switching layers for the 1TnR resistive memory cell array.

25. The memory apparatus of claim 21, further comprising a field programmable gate array formed as part of the memory apparatus, and a third memory array at least in part within the first set of backend memory layers and forming non-volatile configuration bits for the field programmable gate array.

26. The memory apparatus of claim 21, further comprising:
a set of logic circuits forming a volatile state-change circuitry; and
a third memory array forming a non-volatile retainer node circuit for non-volatile memory backup of information stored by the volatile state-change circuitry.

27. The memory apparatus of claim 21, further comprising:
a second set of backend memory layers overlying the first set of backend memory layers;
a 1TNR resistive memory cell array, where N is a second integer greater than 1 and different from n, formed within the second set of backend memory layers and overlying the second subset of the backend memory layers and the 1TnR resistive memory cell array; and
a third set of interconnects connecting the 1TNR memory array to a third of the plurality of MOS devices formed in the substrate.

28. The memory apparatus of claim 21, wherein the MOS devices comprise a device selected from the group consisting of: a memory controller, a central processing unit, a radio and a sensor.

29. The memory apparatus of claim 21, wherein the memory apparatus is a unified memory apparatus comprising at least one of:
a host interface for operable connection with a host device; or
a memory interface for operable connection with a removable memory slot of a computing device.

30. The memory apparatus of claim 29, wherein the MOS devices comprise a member selected from the group consisting of: a transistor, a decoder, a central processing unit, a sense amp, a charge pump, an error correction code module, and a direct memory access engine.

31. A method of fabricating a memory apparatus, comprising:
   providing a substrate for the memory apparatus comprising a plurality of MOS devices formed in the substrate;
   forming a first back-end-of-line (BEOL) layer overlying the substrate;
   forming a first one-transistor, multiple resistor (1TnR wherein n is an integer greater than 1) device layer from a first portion of the first BEOL layer;
   forming a first one-transistor, one-resistor (1T1R) device layer from a second portion of the first BEOL layer;
   forming a second BEOL layer;
   forming a second 1TnR device layer from a first portion of the second BEOL layer; and
   forming a second 1T1R device layer from a second portion of the second BEOL layer.

32. The method of claim 31, further comprising forming a first set of logic components in a third portion of the first BEOL layer and the second BEOL layer.

33. The method of claim 32, further comprising forming a vertical interconnect between a 1T1R device, the first set of logic components, and one of the plurality of MOS devices formed in the substrate, wherein the 1T1R device is formed at least in part from the first 1T1R device layer and the second 1T1R device layer.

34. The method of claim 31, further comprising forming a second set of logic components in a fourth portion of the first BEOL layer and the second BEOL layer.

35. The method of claim 34, further comprising forming a second vertical interconnect between a 1TnR device, the second set of logic components, and a second of the plurality of MOS devices formed in the substrate, wherein the 1TnR device is formed at least in part from the first 1TnR device layer and the second 1TnR device layer.

36. The method of claim 34, further comprising:
   forming a third BEOL layer and a fourth BEOL layer overlying the first BEOL layer and the second BEOL layer;
   forming a third 1TnR device layer from a first portion of the third BEOL layer;
   forming a fourth 1TnR device layer from a first portion of the fourth BEOL layer;
   forming a non-volatile memory device at least in part from the first 1TnR device layer and the second 1TnR device layer; and
   forming a selector device in electrical series with the non-volatile memory device at least in part from the third 1TnR device layer and the fourth 1TnR device layer.

37. The method of claim 36, further comprising forming a dielectric material in second portions of the third BEOL layer and the fourth BEOL layer that overly the second portion of the first BEOL layer and the second portion of the second BEOL layer.

38. The method of claim 37, further comprising:
   forming a vertical interconnect in the second portion of the third BEOL layer and the second portion of the fourth BEOL layer having one end in electrical contact with a top electrode of the 1T1R device;
   forming a conductive line overlying and in electrical contact with a second end of the vertical interconnect; and
   connecting the conductive line to one of the plurality of MOS devices formed in the substrate.

39. The method of claim 36, further comprising:
   forming a third 1T1R device layer from a second portion of the third BEOL layer;
   forming a fourth 1T1R device layer from a second portion of the fourth BEOL layer; and
   forming a second non-volatile memory device at least in part from the first 1T1R device layer and the second 1T1R device layer; and
   forming a second selector device at least in part from the third 1T1R device layer and from the fourth 1T1R device layer.

40. The method of claim 39, further comprising forming the second selector device in electrical series with the second non-volatile memory device.

* * * * *